United States Patent [19]
Phillips et al.

[11] Patent Number: 5,712,628
[45] Date of Patent: Jan. 27, 1998

[54] DIGITALLY PROGRAMMABLE RADIO MODULES FOR TRANSPONDER SYSTEMS

[75] Inventors: William C. Phillips, Ellicott City; Michael V. Pascale, Millersville; Ronald W. Minarik, Lutherville; Kenneth M. Schmidt, Ellicott City, all of Md.

[73] Assignee: Northrop Grumman Corporation, Los Angeles, Calif.

[21] Appl. No.: 522,059

[22] Filed: Aug. 31, 1995

[51] Int. Cl.$^6$ .................. G01S 13/87; G01S 13/80; H01Q 9/00
[52] U.S. Cl. .................. 340/825.54; 455/49.1; 342/42; 342/51; 342/30; 340/825.49
[58] Field of Search .................. 340/825.54, 505, 340/568, 572, 825.35, 825.49; 342/42, 44, 51, 29, 30, 38, 39; 455/49.1; 235/380, 382.5, 382

[56] References Cited

U.S. PATENT DOCUMENTS

| | | | |
|---|---|---|---|
| 3,946,393 | 3/1976 | Dunne et al. | 343/6.8 R |
| 3,981,440 | 9/1976 | Richardson | 235/92 FR |
| 4,137,531 | 1/1979 | Pell | 343/65 R |
| 4,533,917 | 8/1985 | Reed | 343/379 |
| 5,144,314 | 9/1992 | Malmberg | 342/44 |
| 5,317,316 | 5/1994 | Sturm et al. | 342/30 |
| 5,334,982 | 8/1994 | Owen | 342/36 |
| 5,390,360 | 2/1995 | Scop et al. | 455/34.2 |

FOREIGN PATENT DOCUMENTS

| | | |
|---|---|---|
| A-0-534-255 A2 | 3/1993 | European Pat. Off. |
| WO 95/10889 | 4/1995 | WIPO |

*Primary Examiner*—Brian Zimmerman
*Assistant Examiner*—Yonel Beaulieu
*Attorney, Agent, or Firm*—Walter G. Sutcliff

[57] ABSTRACT

A programmable digital radio is configured to perform transponder functions. A receiver in the programmable digital radio receives analog signals from an interrogator and digitizes the analog signals to produce digital interrogation signals. The digital interrogation signals are processed digitally and valid interrogations are detected. Processing includes detection of pulses, determination of each pulse's threshold, determination of intervals between pulses and whether the intervals meet mode criteria, and determination of priority of output of digital messages encoded in the pulses. At least one message is supplied to a transmit module in the programmable radio. The transmit module performs diversity processing on the received message to determine to which received signal to reply, produces reply data and modulates the reply data to produce intermediate frequency signals. The intermediate frequency signals are then converted to analog signals which are transmitted to the interrogator.

22 Claims, 18 Drawing Sheets

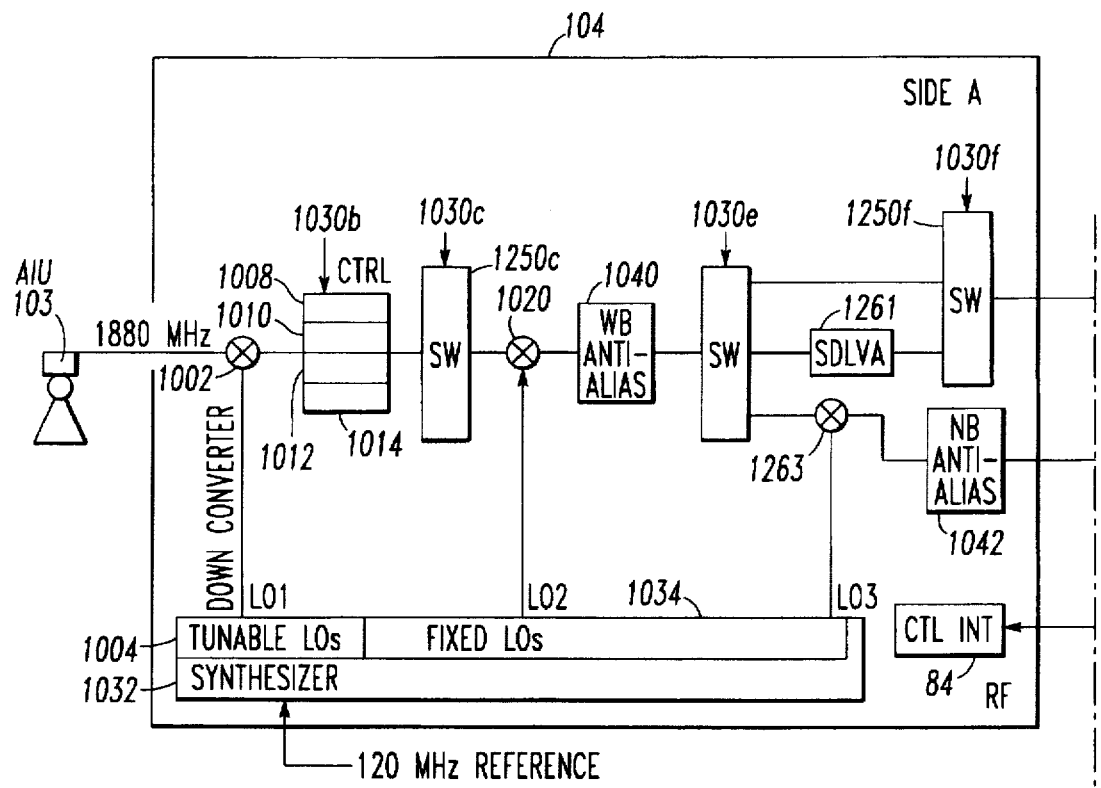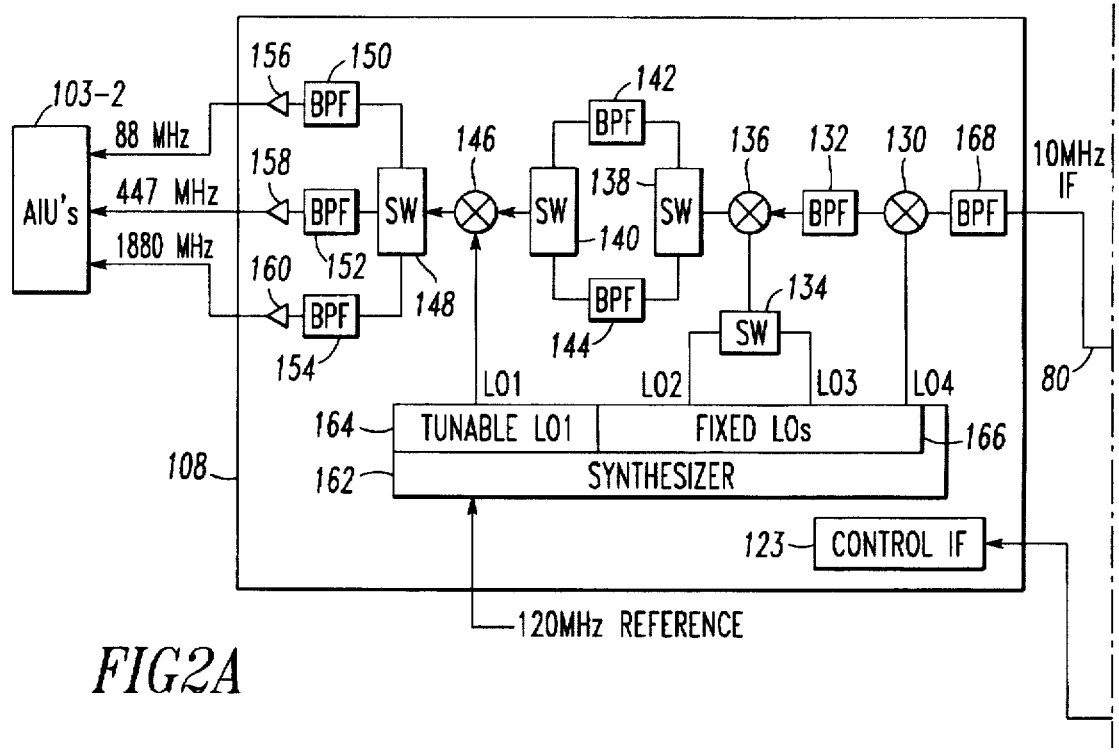
FIG2A

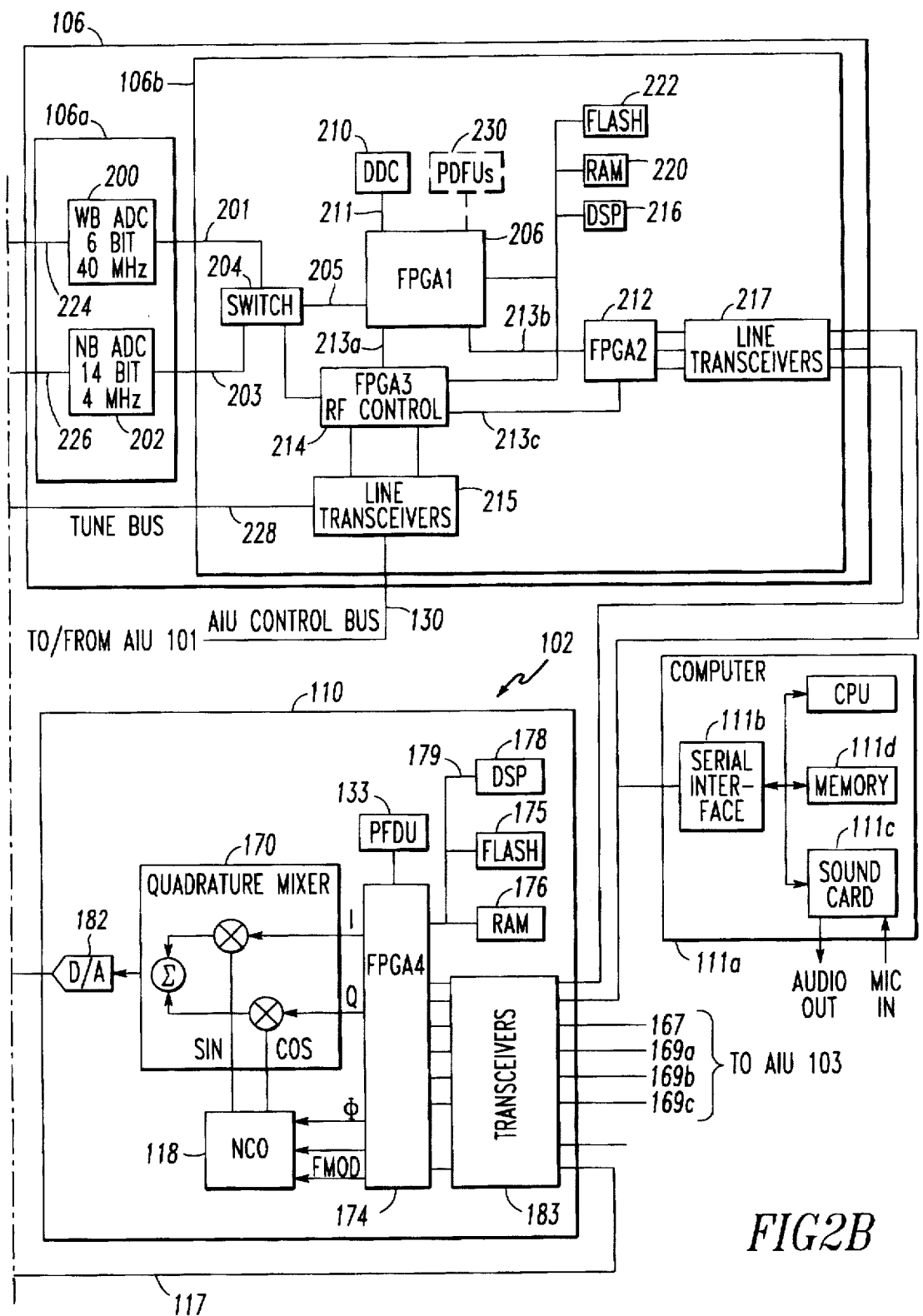

DIGITALLY PROGRAMMABLE RADIO MODULES FOR TRANSPONDER SYSTEMS

CROSS REFERENCE TO RELATED APPLICATIONS

This application is related to concurrently filed U.S. Application entitled DIGITALLY PROGRAMMABLE MULTIFUNCTION RADIO SYSTEM ARCHITECTURE, having U.S. Ser. No. 08/522,050 filed on Aug. 31, 1995; WIDE-BAND RADIO-FREQUENCY CONVERTER HAVING MULTIPLE USE OF INTERMEDIATE FREQUENCY TRANSLATORS, having U.S. Ser. No. 08/322,513 filed on Aug. 14, 1994 and issued as U.S. Pat. No. 5,548,839 on Aug. 20, 1996; COMMON RECEIVE MODULE FOR A PROGRAMMABLE DIGITAL RADIO, having U.S. Ser. No. 08/528,206 filed on Aug. 31, 1995; COMMON TRANSIT MODULE FOR A PROGRAMMABLE DIGITAL RADIO, having U.S. Ser. No. 08/522,058 filed on Aug. 31, 1995; and VHF-AM RADIO SYSTEM, having U.S. Ser. No. 08,522,056 filed on Aug. 31, 1995 and DIGITALLY PROGRAMMABLE RADIO MODULES FOR NAVIGATION SYSTEMS, having U.S. Ser. No. 08,522,057 filed on Aug. 31, 1995, and all incorporated by reference herein.

BACKGROUND OF THE INVENTION

1. Field of the Invention

The present invention is directed to a digitally programmable radio including a receiver and a transmitter that can be digitally reconfigured to operate over a broad radio band and with different signal formats and, more particularly, to a system that provides dynamically programmable and configurable channels using digital channel components to maximize reconfiguration flexibility for use in identification systems such as Air Traffic Control Radar Beacon Systems (ATCRBS) and Identify Friend or Foe Systems (IFF). Although ATCRBS is normally referred to in this application, an IFF system, particularly for modes 3A and C is similar. Other transponder systems are also similar and may be easily developed by one skilled in the art.

2. Description of the Related Art

Many commercial and military applications require multiple communication, navigation, and identification (CNI) or telemetry radio frequency (RF) functions to be performed at a single location. The conventional method for servicing multiple CNI functions is to use independent radio frequency (RF) receivers, each covering a specific portion of the RF band corresponding to a specific CNI function.

Various applications require greater than 10 different types of CNI radios. At one extreme, communication, navigation and identification (CNI) multi-radio suites are comprised of an independent and different type radio channels for each radio functional thread. At the other extreme, integrated programmable radio systems, now in development, cross-couple various elements of multiple channels, which results in a highly complex system of tightly coupled resources.

Both approaches, including hybrids of the two approaches, have advantages as well as major disadvantages. For example, the independent channel systems must have complete backup systems for all critical systems, such as instrument landing systems (ILS), which can be very costly. Further, size and weight of the system precludes implementation of multiple CNI functions in many manpack and vehicular applications. The cross-coupled systems are extremely difficult to maintain because fault isolation is difficult due to the complexity of signal distribution and switching, and this discourages addition of new or modified functions due to a high cost of recertification.

A programmable common digital radio is needed which provides an integrated solution for many different types of multi-function CNI suites provided in a small size, with a light weight at a low cost, without the disadvantages suffered by other architectures as described above.

SUMMARY OF THE INVENTION

Accordingly, it is an object of the present invention to provide a programmable radio that can be quickly reconfigured for a transponder function.

It is an additional object of the present invention to provide a radio which will operate over the 1.5 MHz to 1870 GHz range.

It is a further object of the present invention to provide common identical modules that can be easily reconfigured for many different types of radio functions including a transponder function thus allowing reduction in the number of spares or backup modules required for a given level of system availability.

It is an object to provide a system in which the channels can be dynamically reprogrammed.

It is another object of the present invention to provide modules in which hardware and software upgrades can be made at the module level rather than impacting two or more modules or the whole system.

It is also an object of the present invention to provide modules that are arranged in a way that permits relatively easy maintenance and checkouts for performance as a transponder system.

It is a further object of the present invention to provide a programmable radio which performs transponder functions at a lower cost than traditional systems.

It is an additional object of the present invention to use high speed digital techniques to detect valid interrogations with high probability of detection and low probability of false alarm.

It is a still further object of the present invention to provide a transponder function in a completely reprogrammable radio to allow implementation in a multiple function system.

It is an object of the present invention to perform pulse detection, interval discrimination and reply generation on interrogation pulse trains which may be interleaved with other interrogation pulse trains.

It is a further object of the present invention to determine a highest priority mode when simultaneous interrogations occur.

The above objects can be accomplished by a system that partitions or divides the functions of a radio channel into two major functions:

1) antenna interface (and power amplification in the case of transmitting); and
2) mixing, modulation/demodulation and signal processing and further partitions the mixing through signal processing functions into the functions of:
    a) programmable analog mixing and
    b) programmable digital demodulation/modulation and signal processing. Control and user interface functions, if needed for a particular application are also functionally partitioned. A typical received RF signal pathway will encounter an antenna, an antenna interface unit and a receive module. The receive module is partitioned into an analog submodule that performs mixing and down conversion to produce analog common intermediate frequency signals and a digital submodule that converts the analog common intermediate frequency signal into a digital signal. The digital signal may then be processed in a variety of ways by programmable hardware and software. A typical transmitter pathway includes a transmit module partitioned into a digital submodule that performs digital signal processing and modulation of an information signal to be transmitted into a common intermediate frequency signal which is converted into an analog intermediate frequency signal, and an analog submodule that performs analog frequency conversion and mixing, followed by a power amplification and interface module and an antenna.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 2A and 2B are a more detailed block diagram of the digital programmable radio showing a programmable common receive module and a programmable common transmit module.

DISCLOSURE OF THE INVENTION

Figure 1:
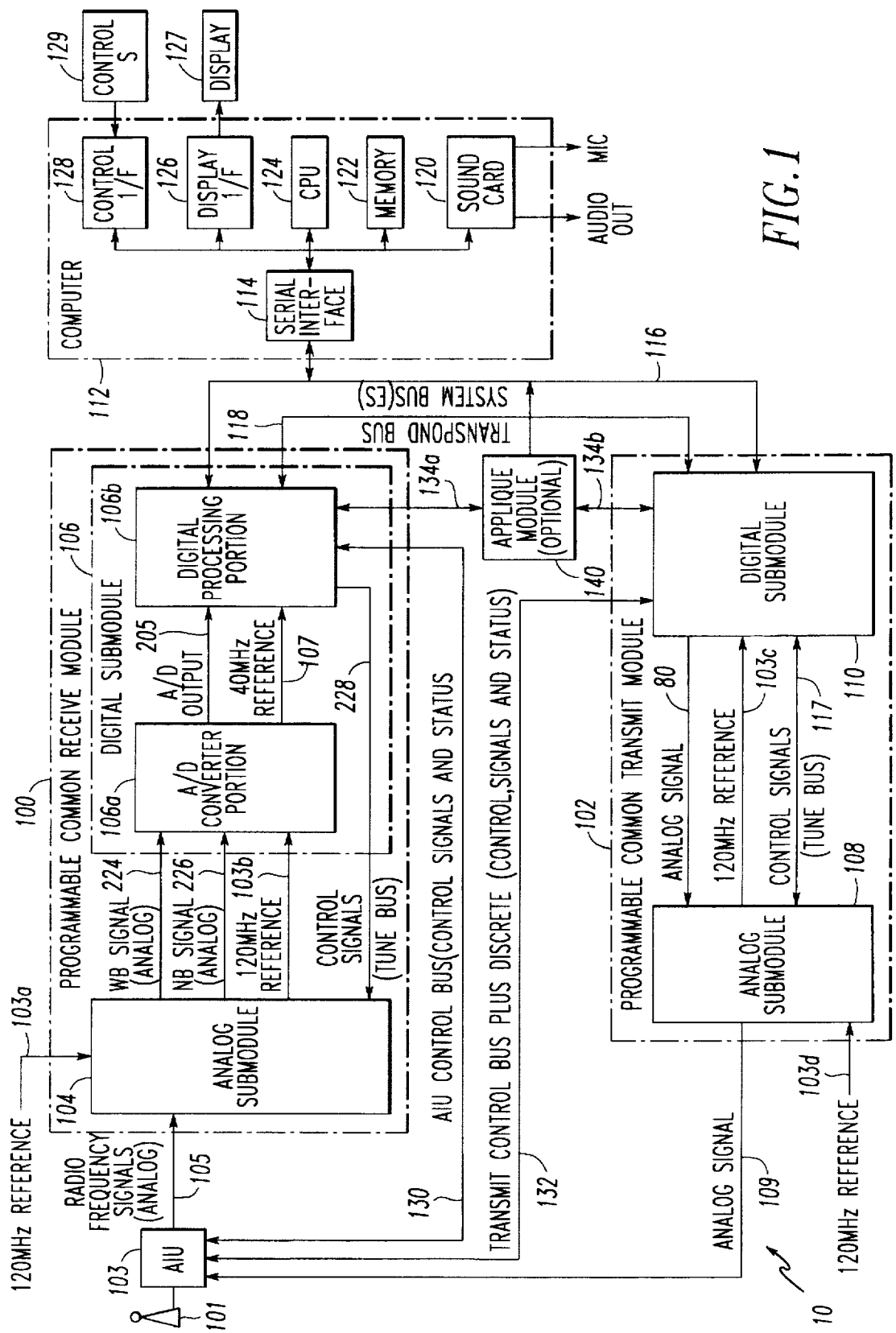
FIG. 1 is a block diagram of a digital programmable radio.

FIG. 1 is a block diagram illustrating a programmable common receive module (PCRM) 100 and a programmable common transmit module (PCTM) 102. The PCRM 100 comprises an analog submodule 104 and a digital submodule 106. The analog submodule 104 receives radio frequency (RF) signals within a range of interest, in this example, approximately 2 MHz to 2000 MHz and outputs intermediate frequency (IF) signals. The analog submodule 104 of the PCRM 100 is described in related U.S. disclosure entitled WIDE-BAND RADIO-FREQUENCY CONVERTER HAVING MULTIPLE USE OF INTERMEDIATE FREQUENCY TRANSLATORS and also in COMMON RECEIVE MODULE FOR A PROGRAMMABLE DIGITAL RADIO, and the digital submodule is described in related U.S. disclosure entitled COMMON RECEIVE MODULE FOR A PROGRAMMABLE DIGITAL RADIO, both incorporated herein by reference.

Similarly, the PCTM 102 is partitioned into an analog submodule 108 and a digital submodule 110. The digital submodule 110 receives digital signals and outputs IF signals. The programmable common transmit module (PCTM) 102 is described in related U.S. disclosure entitled COMMON TRANSMIT MODULE FOR A PROGRAMMABLE DIGITAL RADIO, incorporated herein by reference.

A system bus 116 couples the PCRM 100 to the PCTM 102 and external devices. More specifically, the system bus 116 connects the digital submodule 106 of the PCRM 100 to the digital submodule 110 of the PCTM 102 and to external devices such as a computer 112, a UART 114, and a sound card 120. Additionally, a transpond bus 118 connects the PCRM 100 to the PCTM 102.

The PCRM 100 is comprised of a single module (a plug-in module for many applications) that receives RF (analog) signals from an antenna interface unit (AIU) 103, described in more detail in the related architecture disclosure, or from a distribution network and outputs relatively low-speed serial digital data. Inside the PCRM 100, RF signals are translated in frequency through various IFs, digitally sampled and processed according to the CNI programmed configuration, and routed to an appropriate digital output. Containment of major signal operations in a single unit greatly facilitates logistics, built-in test/fault-isolation test (BIT/FIT) and maintenance.

Similarly, the PCTM 102 is comprised of a single module (a plug-in module for many applications) that receives digital data from the system bus 116 or the transpond bus 118 and outputs RF (analog) signals to an antenna interface unit (AIU) 103, described in more detail in the related architecture disclosure. Inside the PCTM 102, digital signals are modulated and processed according to the CNI programmed configuration, and routed to an appropriate antenna output.

The antenna 101 is coupled to the PCRM 100 through, for example, an antenna interface unit 103. The antenna 101 receives a signal and provides an analog output signal to the PCRM 100. The PCRM performs analog functions of converting the received RF signal into a final intermediate frequency signal using an analog frequency synthesizer and multiple frequency conversion stages. Additionally, analog-to-digital conversion of a final intermediate frequency signal into a digital signal is performed in either the analog submodule 104 or digital submodule 106 as detailed in the DIGITALLY PROGRAMMABLE MULTIFUNCTION RADIO SYSTEM ARCHITECTURE and COMMON RECEIVE MODULE FOR A PROGRAMMABLE DIGITAL RADIO. Further, special signal processing is performed in the digital submodule and a digital information signal is provided.

The digital submodule 106 includes reconfigurable units which are each reconfigurable to provide different functions for receiving signals for different radio communication applications.

The PCTM 102 receives, processes and transmits information. More specifically, the digital submodule 110 receives a serial bit stream and produces a modulated intermediate frequency carrier signal. The digital submodule 110 receives a serial bit stream representing information to be transmitted, and after processing data it produces a modulated intermediate frequency carrier signal. The digital submodule 110 includes a reconfigurable unit which is reconfigurable to provide different functions for transmitting signals for different radio communication applications.

The analog submodule 108 of the PCTM 102 receives the modulated intermediate frequency carrier signal and frequency converts the modulated intermediate frequency carrier signal to a frequency corresponding to the specific type of radio communication.

When operating in a transponder mode, a transpond bus 118 is employed. The PCRM 100, via the antenna 101 and the AIU 103, receives an interrogation signal in the same manner as described above in the general case. However, because the receive-to-transmit time requirement for transponder operations can be relatively short, typically as fast as 3 microseconds, the transpond bus 118 is employed as a direct connection of sufficiently high speed between the PCRM 100 and the PCTM 102. (Fortunately, when operating in a transponder mode, the PCRM 100 and the PCTM 102 can be tuned well in advance to receive and transmit, respectively, on predetermined frequencies.)

After receiving and processing an interrogation signal, the PCRM 100 determines whether a reply to an interrogation is required and, if so, a reply mode required (for example, airplane identification or airplane altitude). The PCRM 100 generates a pulse information signal over the transpond bus 118 that informs the PCTM 102 as to whether to respond (i.e., transmit a reply); in which mode to respond; and a measured receive signal level. Prior to reception of the signal, the PCTM 102 is preloaded with an airplane identification code and with a latest airplane altitude as determined by onboard sensors. This information is relayed to the PCTM 102 via a controller similar to computer 112. In addition, the PCTM 102 may utilize measured receive signal levels from multiple PCRMs 100 (only one PCRM is shown in FIG. 2). Each PCRM 100-n is connected to a different antenna such as, for example, top and bottom antennas on an airplane. The PCTM 102 receives a respective serial bitstream, each having a respective signal level, from each PCRM 100-n and determines which antenna received a stronger original signal. The PCTM 102 then compares the respective signal levels from the PCRMs 100-n and directs AIU 103, via transmit discrete line 1696, to switch transmission of (not shown) an output from PCTM 102 to the antenna that received the stronger signal. For additional description of such antenna diversity see the related disclosure DIGITALLY PROGRAMMABLE MULTIFUNCTION RADIO SYSTEM ARCHITECTURE.

As shown in FIG. 2, all high-speed processing (such as A/D conversion by A/D converters 200 and 202, down conversion by digital downconverter DDC 210, waveform processing by DSP 216 and bit stream processing by 206 in the PCRM 100 and similarly for the PCTM 102) and major parallel interconnects are completely contained inside the digital submodule 106, thereby greatly simplifying backplane complexity, and reducing electromagnetic interference (EMI) to the rest of the system. Both the PCRM 100 design and the PCTM 102 design handle the internal EMI between the analog and digital portions using separate circuit boards, shielding and isolation.

Related disclosures DIGITALLY PROGRAMMABLE MULTIFUNCTION RADIO SYSTEM ARCHITECTURE, COMMON RECEIVE MODULE FOR A PROGRAMMABLE DIGITAL RADIO, and COMMON TRANSIT MODULE FOR A PROGRAMMABLE DIGITAL RADIO disclose this structure in detail.

The PCRM 100 generally includes an analog submodule 104 and a digital submodule 106 and the PCTM generally includes an analog submodule 108 and a digital submodule 110.

ANALOG SUBMODULE OF PCRM

A wide band radio frequency (RF) to intermediate frequency (IF) multifunction receiver including a frequency converter obtains improved utilization of installed circuitry by employing a single tunable frequency converter for any of the RF signals in the entire band. The tunable frequency converter accepts any signal in the RF range of interest, for example, approximately 2 MHz to 2000 MHz, at a tunable first frequency translator. Several different filters having different center frequencies and different bandpass widths are included in the analog submodule of the PCRM.

Figure 3A:
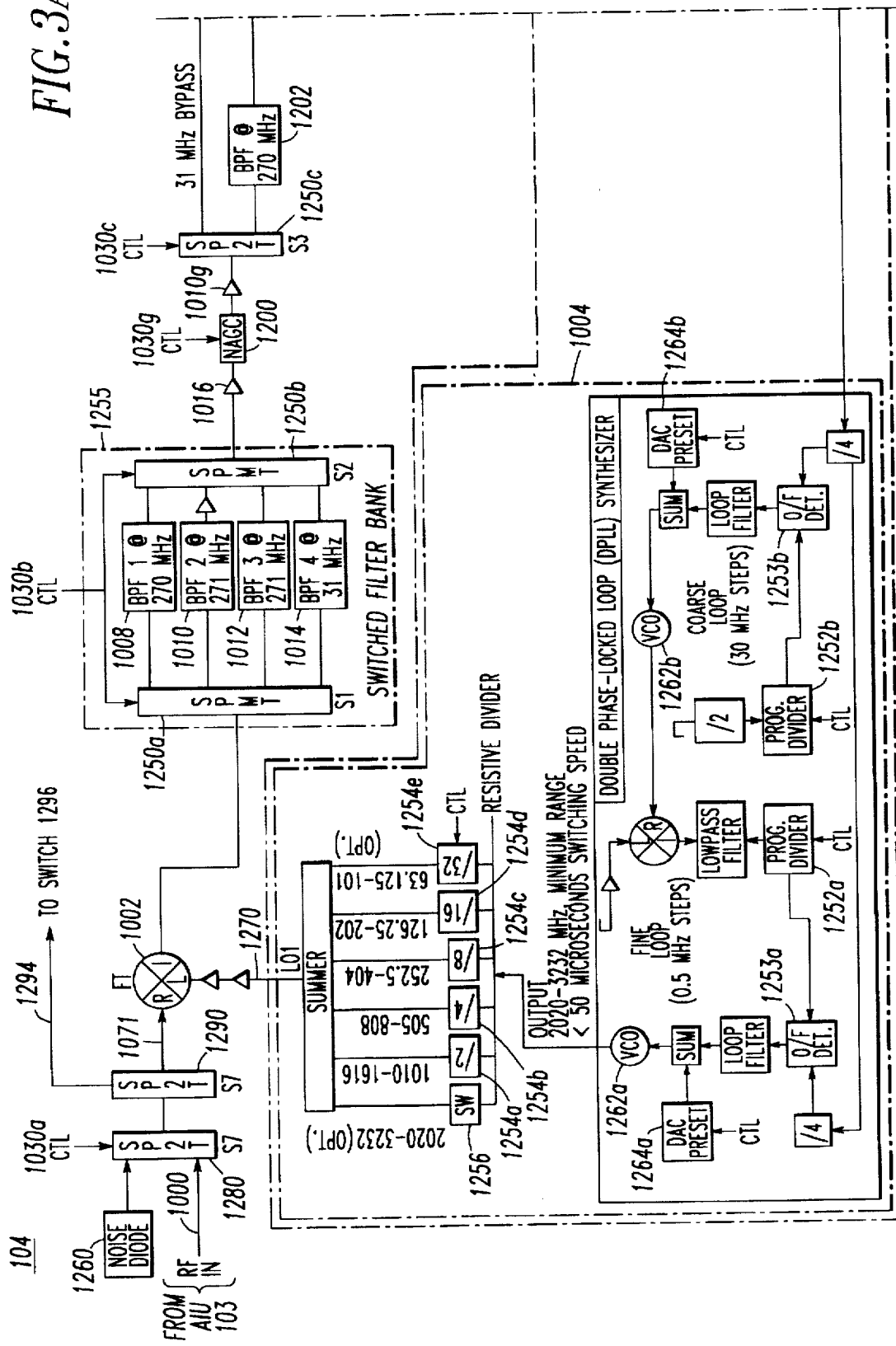
FIG. 3A and 3B are a block diagram of an analog submodule of the programmable common receive module illustrating signal flow for a transponder system.
Figure 3B:
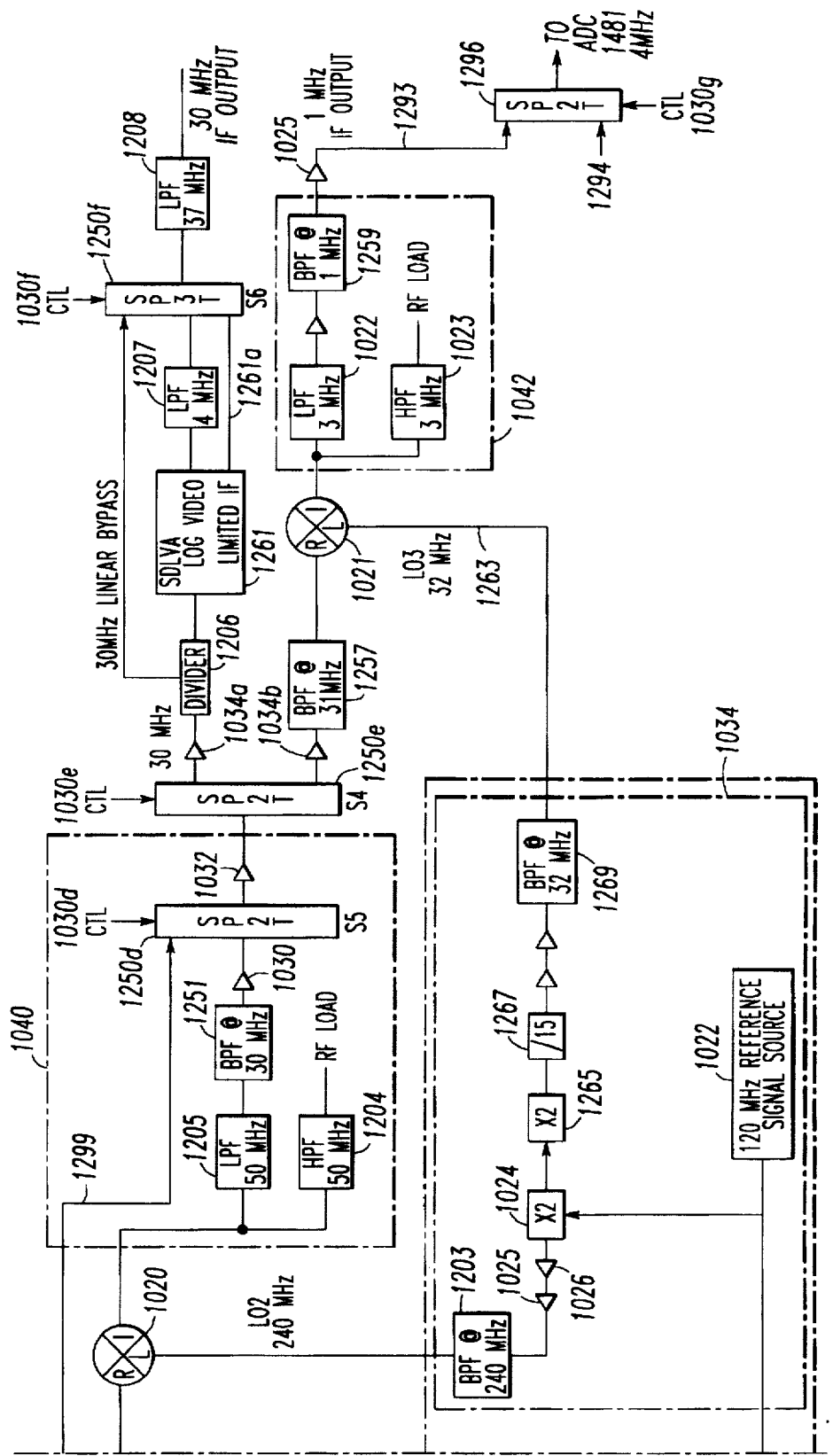

More specifically, as shown in FIG. 3, an RF input signal 1000 is received by a first switch (SP2T) 1280, such as a single pole double throw switch. Additionally, a signal, such as a test signal, from a noise diode 1260 is also supplied to the SP2T 1280. A control signal CTL 1030a, from a control interface 84, shown in FIG. 4, selects the RF input signal at SP2T 1280. The output of the SP2T 1280 is supplied to an input of a second switch 1271, such as a single pole double throw switch. The second switch 1290 has two outputs, one of which, 1071, passes to a first frequency translator 1002 and which is used to service the RF functions between approximately 1.5 MHz and 1870 MHz as described in the related disclosure. The first frequency translator 1002 is, for example, a single tunable frequency translator. For ATCRBS and standard IFF the RF input signal is at approximately 1030 MHz. The second output is not used in the ATCRBS application.

Oscillator circuitry 1004, described in detail in the disclosure WIDE BAND RADIO-FREQUENCY CONVERTER HAVING MULTIPLE USE OF INTERMEDIATE FREQUENCY TRANSLATORS, and also described in disclosure COMMON RECEIVE MODULE FOR A PROGRAMMABLE DIGITAL RADIO, provides a tunable local oscillator signal LO1 to the single tunable frequency translator 1002. The single tunable frequency translator 1002 mixes the tunable local oscillator signal LO1 with the received RF input signal to generate a mixed intermediate frequency signal. The mixed intermediate frequency signal is supplied to a third switch, such as, for example, a single pole multiple throw switch, (SPMT) 1250a and then to a selected filter of a plurality of filters, such as, for example, 1008, 1010, 1012 and 1014. Each filter of the plurality of filters corresponds to a specific application of communication, navigation and identifier functions. A control signal 1030b supplied from control interface 84a controls which of the plurality of filters 1008, 1010, 1012 and 1014 is selected to receive the output signal of the SPMT 1250a.

In the ATCRBS application, an approximate 1030 MHz output signal of the SPMT 1250a is supplied to the selected filter, which is, for example, a band pass filter having a center frequency at 270 MHz and a bandwidth of 20 MHz.

A fourth switch 1250b, such as, for example, a single pole multiple throw (SPMT) receives the output signals from bandpass filter 1008, in this example, based on the control signal 1030b, and supplies a filtered signal to a first amplifier 1016. The first filtered signal is next supplied to a noise automatic gain control unit (AGC) 1200 and a second amplifier 1010g. The second amplifier 1018 outputs an amplified signal for setting a level of thermal noise associated with the received RF input signals of interest, at the 30 MHz IF output 224 of the analog submodule 104 of the PCRM 100.

The amplified signal from the second amplifier 1010 is supplied to a fifth switch, such as, for example, a single pole double throw switch (SP2T) 1250c controlled by a control signal 1030c. The single pole double throw switch 1250c outputs a signal to a second bandpass filter 1202 having, for example, a center frequency of 270 MHz which produces a second filtered signal. A second frequency translator 1020, such as, for example, a fixed local oscillator frequency translator receives the second filtered signal and a second local oscillator signal LO2. The second local oscillator signal LO2 is supplied by a reference signal source 1022 via a frequency doubler 1024, third and fourth amplifiers 1026 and 1025, and a third bandpass filter 1203. The third bandpass filter 1203 has, for example, a center frequency of 240 MHz.

The second frequency translator 1020 produces a translated signal which is supplied to a first low pass filter 1205, having, for example, a cut-off frequency of 50 MHz, and a first high pass filter 1204, having, for example, a cut-off frequency of 50 Mhz. The first high pass filter 1204 supplies an RF load signal and the first low pass filter 1205 supplies a low pass filtered signal to a third bandpass filter 1251, having a center frequency of, for example, 30 Mhz, which produces a third filtered signal. The third filtered signal is then supplied to an amplifier 1030, producing an amplified third filtered signal.

The amplified third filtered signal is supplied to a fifth switch 1250d, such as a single pole double throw control SP2T) controlled by a control signal 1030d which passes the amplified third filtered signal to a fifth amplifier 1032 to produce an amplified band signal. The amplified band signal is supplied to a sixth switch 1250e, such as a single pole double throw switch (SP2T).

The SP2T 1250e passes both narrow band and wide band signals of the amplified band signal based on a control signal 1030e. In the ATCRBS application, wide band signals are utilized. Therefore, switch 1250e passes the wide band signals from amplifier 1032 to an amplifier 1034a and an amplified wide band signal is generated. The amplified wide band signal is next provided to a divider 1206. The divider 1206 provides a 30 Mhz linear bypass to a seventh switch 1250f, such as, for example, a single pole triple throw switch (SP3T).

Additionally, the divider 1206 provides a signal to a sequential detection log video amplifier (SDLVA) 1261 which outputs logarithmic video signals which are provided to a second low pass filter 1207, having a cut-off frequency of 4 Mhz, to produce filtered logarithmic video signals. The SDLVA 1261 also generates limited IF signals.

Based upon a control signal 1030f, for standard ATCRBS and IFF, the SP3T 1250f accepts the filtered logarithmic video signals from the LPF 1207 and outputs this signal to a third low pass filter 1208, having a 37 Mhz cut-off frequency. (Other embodiments may alternatively pass the 30 Mhz linear bypass signal through switch 1205f.) The third low pass filter 1208 thus outputs wide-band intermediate frequency signals commensurate with standard ATCRBS and IFF signals.

Figure 4:
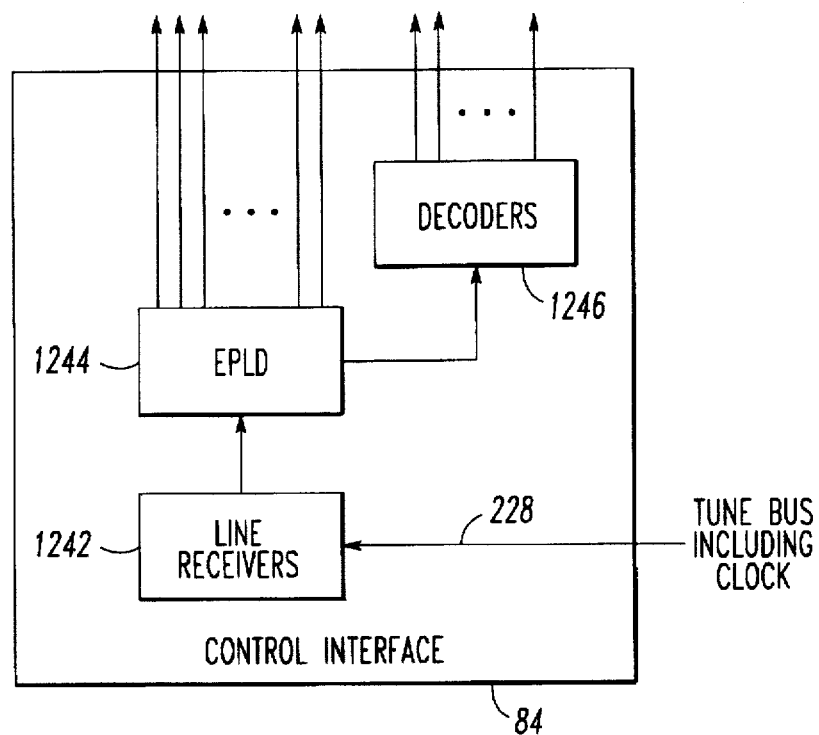
FIG. 4 is a block diagram of a control interface in the analog submodule.

FIG. 4 illustrates a configuration of the control interface 84 in the analog submodule 104. The control interface aids in providing the control signals such as 1030a–g to indicate the application and function desired.

DIGITAL SUBMODULE OF THE PCRM

Figure 5:
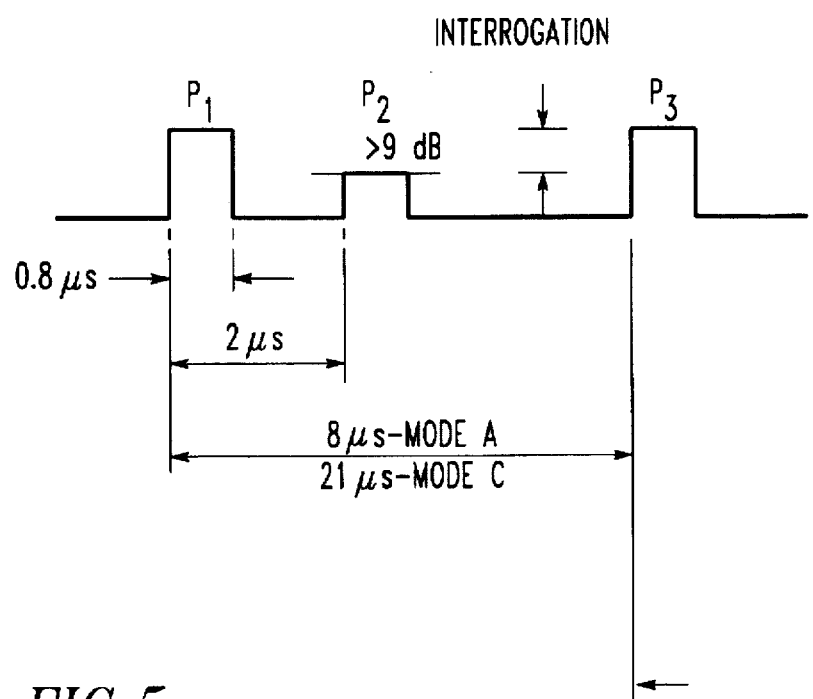
FIG. 5 illustrates an example of a signal including pulses received by a digital submodule of the programmable common receive module.

FIG. 5 illustrates a sequence of pulses of an ATCRBS, IFF or other transponder interrogation which may be, for example, received by a first FPGA on the digital submodule 106. The ATCRBS/IFF application processes many different modes of interrogation including Mode C for requesting an aircraft's altitude and Mode 3A requesting an aircraft's assigned identification number.

As shown in FIG. 5, an ATCRBS interrogation is comprised of pulses such as P1, P2, and P3. To determine which mode the ATCRBS interrogation is indicating, a distance between pulses P1 and P3 must be determined. Only pulses that meet specific criteria for pulse width, amplitude, and frequency are considered valid pulses. For example, if a timing difference between respective rising edges of P1 and P3 is 8 microseconds, then Mode 3A is indicated and the transponder should reply by transmitting an identification number. If the timing difference between P1 and P3 is 21 microseconds, then Mode C is indicated and the transponder should reply by transmitting the aircraft's altitude.

In a basic ATCRBS interrogation, P1 and P3 are used to indicate a type of information requested (mode of interrogation) based on their interpulse period or timing difference as described above. A P2 pulse may occur two microseconds after P1. If the P2 pulse is of sufficient amplitude, according to mode criteria, a transponder must suppress replies for a period of time (suppress time period) predetermined. When the transponder is suppressed, replies to any interrogations will not be generated for the suppress time period. After the suppress time period expires, interrogations will be processed normally and replies will be transmitted. A format of the transmitted data will be described later.

Figure 6:
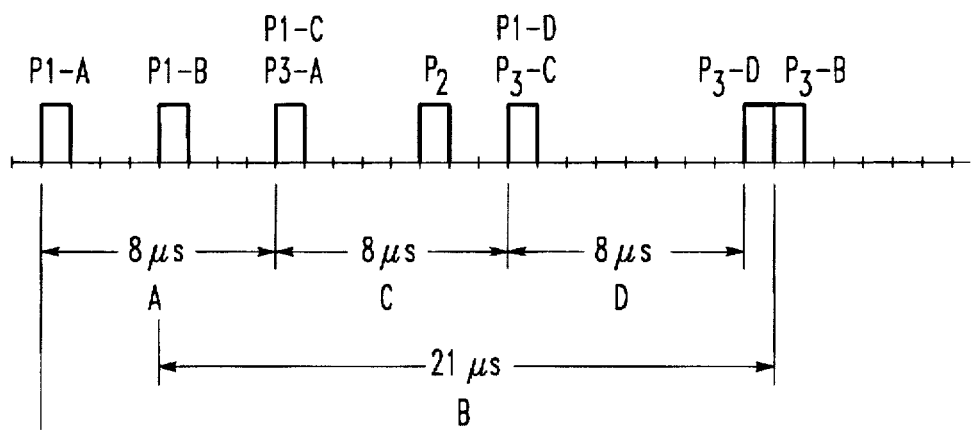
FIG. 6 is an example of a second signal including pulses received by the digital submodule of the programmable common receive module.

Depending upon the configuration of the PCRM 100, multiple pulse trains may be interleaved. In an ATCRBS application of the present embodiment, four pulse trains may be interleaved as shown in FIG. 6. In the example shown, four P1–P3 pulse pair interrogations are labelled with subscripts A, B, C, and D. All four interrogations can be processed simultaneously and, if conflicts occur, a required priority scheme is used to determine an outcome of the conflict.

Figure 7:
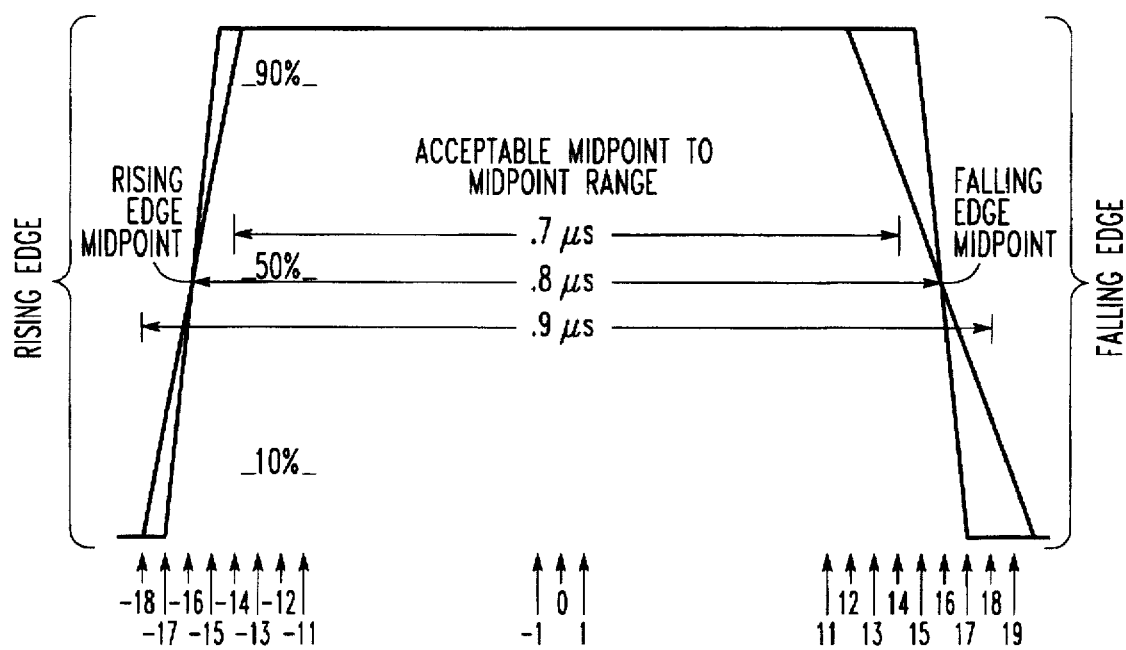
FIG. 7 illustrates a pulse which is received by the digital submodule of the programmable common receive module.

Further, pulses must meet specific criteria as to their width. FIG. 7 illustrates a pulse where the pulse width is measured from a midpoint of the rising edge to a midpoint of a falling edge. A pulse detection function in the ATCRBS application may, for example, attempt to estimate the midpoint of the rising edge of the pulse and the midpoint of the falling edge of the pulse. In the present ATCRBS application, a time period between the estimated midpoints of the rising edge and the falling edge is determined. The pulse is then judged to be acceptable if the determined time period is between 0.7 µsec and 0.9 µsec, and the pulse is of sufficient amplitude.

Figure 8:
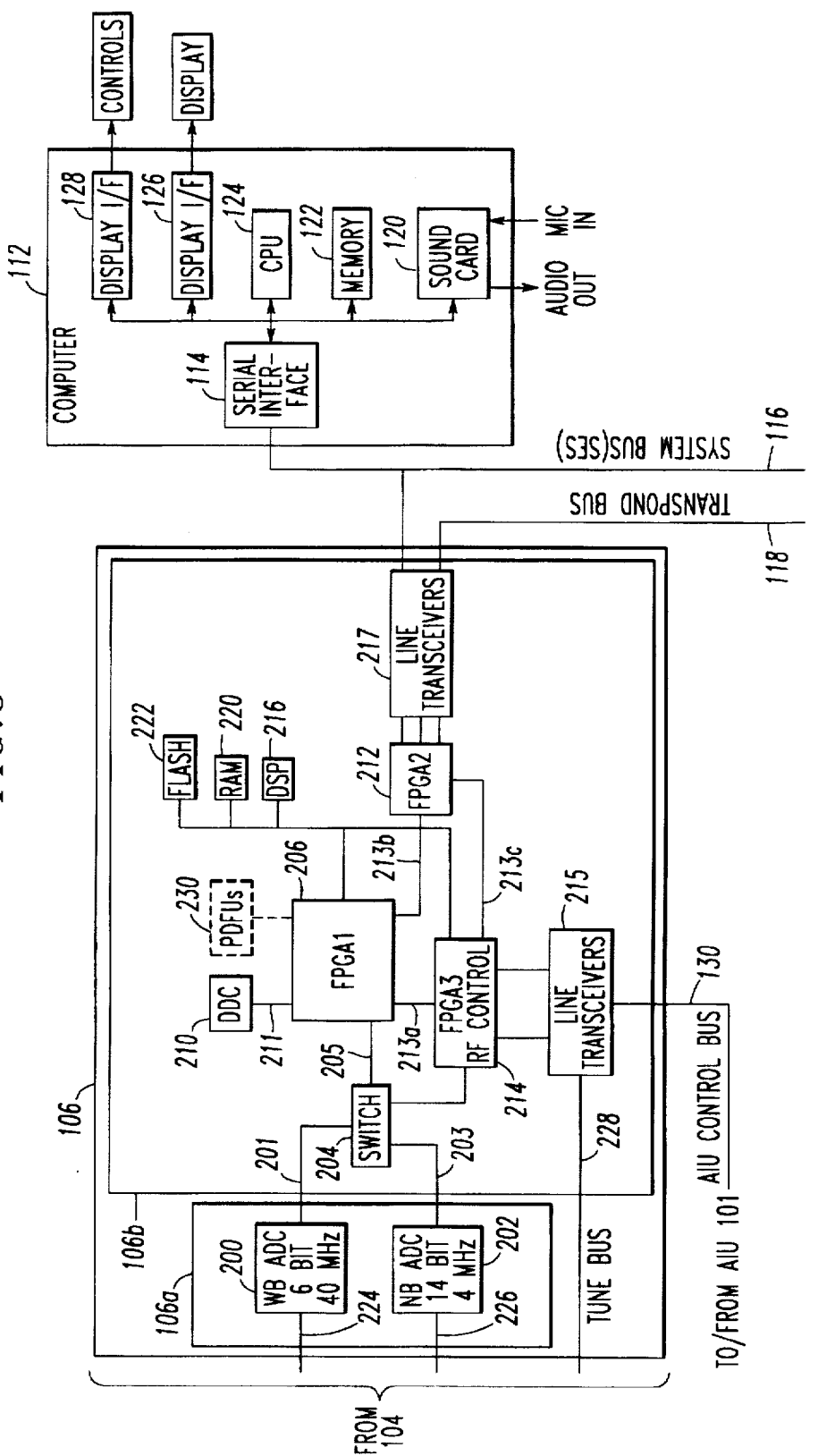
FIG. 8 is a block diagram of the digital submodule of a programmable common receiver module in the digital programmable radio configured for a transponder application.

FIG. 8 is a block diagram of the digital submodule 106 of the PCRM 100. In the present example, the digital submodule 106 of the PCRM 100 includes the analog to digital converters (ADC) 200 and 202 in an analog to digital converter portion (ADCP) 106a. However, the A/D converters are electrically isolated from the other elements of the digital submodule 106. As one alternative, these ADCs 200 and 202 could be on the analog submodule board of PCRM 100. However, in this example, they were included on the digital submodule board due to space considerations. Further detail regarding this configuration may be found in the related COMMON RECEIVE MODULE FOR A PROGRAMMABLE DIGITAL RADIO disclosure.

The digital submodule 106 of the programmable common receive module (PCRM) 100 can service a wide range of CNI functions in an approximate 2 Mhz to 2000 Mhz region. To function as a portion of the PCRM 100, the digital submodule 106 may include, for example, as shown in FIG. 8, analog to digital converters (ADCs) 200 and 202, a switch 204, field programmable gate arrays (FPGAs) 206, 212, and 214, a digital down converter (DDC) 210, a processor (DSP) 216, and storage 220 and 222. Although this hardware may be resident in every digital submodule, the hardware used depends on the application desired. Further, depending on the applications desired to be performed, specific hardware may be added or eliminated as set forth in more detail in the related disclosures listed above.

The digital submodule 106 receives an analog signal 224 or 226 that is band limited to either wide band WB or narrow band NB, respectively. If the signal is wide band, it may be, for example, an IF (intermediate frequency WB signal) limited to ±4000 kilohertz about 30 Mhz, resulting in a total of 8 Mhz of bandwidth maximum. If the signal is narrow band, it may be, for example, limited to ±200 kilohertz about 1 Mhz, resulting in a total of 400 kilohertz of bandwidth maximum.

Two analog to digital converters may be used: one for converting a narrow band (NB) signal 202 and one for converting a wide band (WB) signal 200. In the ATCRBS application, a WB signal 224 is supplied to, for example, a 8-bit 40 Mhz wide band analog to digital converter (WB ADC) 200, such as, for example an AD 9012 AJ available from Analog Devices. By utilizing well-known 4/3 harmonic sampling (i.e., the sampling of the 30 Mhz I/F signal at a sample rate of 40 Mhz), the WB signal at 30 Mhz is folded down to a 10 Mhz region.

Both the WB A/D 200 and the NB A/D 202 are coupled to a converter switch (SW) 204 or a multiplexer which controls which signal is transferred to a digital processing portion 106b of the digital submodule 106. The SW 204 is controlled by switch control bits which indicate whether the WB 224 or NB 226 signal is to be transmitted to the digital processing portion 106b. In the ATCRBS or IFF applications, the WB signal 224 is selected. As a result, 8 bits of data are received from the WB ADC 200 and transmitted with a data valid bit and a clock bit to a first FPGA 206 as a selected digital signal.

In the present invention, three FPGAs 206, 212 and 214 are used to perform selected operations. The FPGAs may be, for example, Altera Flex 81188 Parts. The function of these FPGAs is controlled by configuration data which is set forth in the appendix of the related disclosure COMMON RECEIVE MODULE FOR A PROGRAMMABLE DIGITAL RADIO.

The first FPGA (FPGA1) 206 will receive the selected digital signal and depending upon the application selected and the chip configuration program loaded, perform specified functions or operations including, for example, in the ATCRBS or transponder applications, pulse width discrimination, interval discrimination, transpond bus control, pulse detection and other data processing.

The digital down converter (DDC) 210 is not used in the ATCRBS or IFF applications.

The processor (DSP) 216 may be, for example, a TMS320C31 chip. The DSP 216 may perform various processing functions on various types of signals which may, for example, include signals associated with various NB and WB radio functions. The processing functions may include, for example, decimation; filtering; waveform demodulation of any combination of amplitude; frequency and phase modulation; signal correlation; squelch; management and control of all channel resources (gain, signal path switching, tuning, interfaces both internal to the PCRM 100 as well as to external units, etc.) in both the digital submodule 106, the analog submodule 104 and the associated AIU 103 (FIG. 1); bit stream decoding including error detection and/or correction; BIT control/reporting; Fourier transforms; calculations of difference in depth of modulation (DDM); and formatting control for various terminals such as displays. Further, although sometimes performed elsewhere, the DSP 216, depending upon the processing power implemented, can perform message processing, network functions, and processing of low-data rate speech algorithms. In the ATCRBS and IFF applications, the DSP 216 may perform, for example, configuration of other elements in the PCRM 100 and tuning each PCRM 100 to accept only signals pertaining to the ATCRBS application.

A second FPGA (FPGA2) 212 may be programmed to be configured, for example, to perform interface operations between the local bus 213 and several elements of the digital submodule 106 and a system bus 116, i.e., performing a UART (Universal Asynchronous Receiver/Transmitter) function. Further, the FPGA 212 may also, for example, perform interface operations to a system bus 116, a transpond bus 118 and an applique bus 134a via transceivers located in a multi-transceiver package 217.

A third FPGA (FPGA3) 214, also coupled to the local bus 213, may be configured to perform RF control functions, including providing control bits via a tune bus 228 to the analog submodule 104 of the PCRM 100 through, for example, a transceiver in a multi-transceiver package 215; and via an AIU control bus 130 to the associated AIU 103 also through, for example, a transceiver in the multi-transceiver package 215. The FPGA3 214 may also be configured to perform control functions of various elements of the digital submodule 106 by providing control bits.

In addition, memory may be coupled to the local bus 213 and may include, for example, a 128K bits×32 bits wide random access memory (RAM) 220 and a 128K bits×32 bits wide non-volatile memory such as the common "FLASH" memory or EEPROM (FLASH) 222. The RAM 220 and the FLASH 222 are used to store application specific information, including FPGA configuration data, used during initialization and when switching applications.

The digital submodule 106 may be configured to perform specific functions depending on the application desired, in this case, ATCRBS. The structure of the digital submodule 106 permits changing the configuration to perform a different application within a very short period of time, for example in approximately 100 milliseconds, without requiring a change in hardware and accompanying tests to verify proper functioning. Details as to initialization of the digital submodule 106 are set forth in the disclosure COMMON RECEIVE MODULE FOR A PROGRAMMABLE DIGITAL RADIO incorporated herein by reference.

The program pertaining to the ATCRBS application generally executes from the RAM 220. Each program pertaining to the ATCRBS application includes source code that runs the DSP 216 and data files for each of the FPGAs 206, 212 and 214 and the DDC 210.

Therefore, each FPGA 206, 212 and 214 receives gate configuration information pertaining specifically to the ATCRBS application. The selected application may be altered any time during use. New selection data, indicating that a new application is desired, is received from the system bus 116. The DSP 216 receives the new selection data, recognizes that the currently selected application is to be changed to a newly selected application, determines the location in the RAM 220 of the newly selected application, reads application information from the location of the RAM 220 pertaining to the newly selected application, and transfers the read application information to each of the FPGAs 206, 212 and 214. Each FPGA is then reconfigured to perform specific functions as specified for the newly selected application.

In the ATCRBS application, the selected function is a wide band signal, for example a 30 Mhz IFF signal, which is received by the 8 bit, 40 Mhz WB A/D 200. Switch control bits are sent by the FPGA3 214 to the switch 204 indicating that the wide band signal is to be transferred to the FPGA1 206. The switch 204 couples the 8 bits of data from the WB ADC 200 with a data valid bit and a clock bit (40 Mhz). This 8 bit data is clocked into the first FPGA1 206 at a 40 Mhz rate. The other 6 bits are ignored.

When the digital submodule 106 is performing the ATCRBS application, FPGA1 206 is configured to perform several functions including pulse detection, pulse width discrimination, interval discrimination and mode decoding. As shown in FIG. 7, in this example, 0.8 microseconds is the nominal width of the pulse and pulses of 0.7-0.9 microseconds are accepted as valid pulses. Therefore, pulses having a width of 0.8±0.1 microseconds are valid and should be detected.

Interval Discrimination is performed to measure intervals between the pulses. Based on the measured intervals, a mode of interrogation is determined. This interrogation mode indicates a type of information being requested, i.e., altitude information or identification information.

Thus, the FPGA1 206 generates a pulse information signal. This pulse information signal is provided to the FPGA3 214, which formats the pulse information into a serial digital data stream and then transfers the serial digital data stream onto a transpond bus 118 for response generation.

The FPGA2 212 provides an interface between the DSP 216, RAM 220, FLASH 222, FPGA3 214 and the system bus 116.

The FPGA3 214 is coupled to the transponder bus 118, the local bus 213, the tune bus 228 and the AIU control bus 130. The FPGA3 214 performs receiver control functions in response to an FPGA2 212 control word received over the local bus 213. The FPGA3 214 further generates the switch 204 control signal and tune control bits. In the present example, 56 bits of serial control bits are transferred over the tune bus 228 to the analog submodule 104 of the PCRM 100 for performing tuning and control functions.

Figure 9:
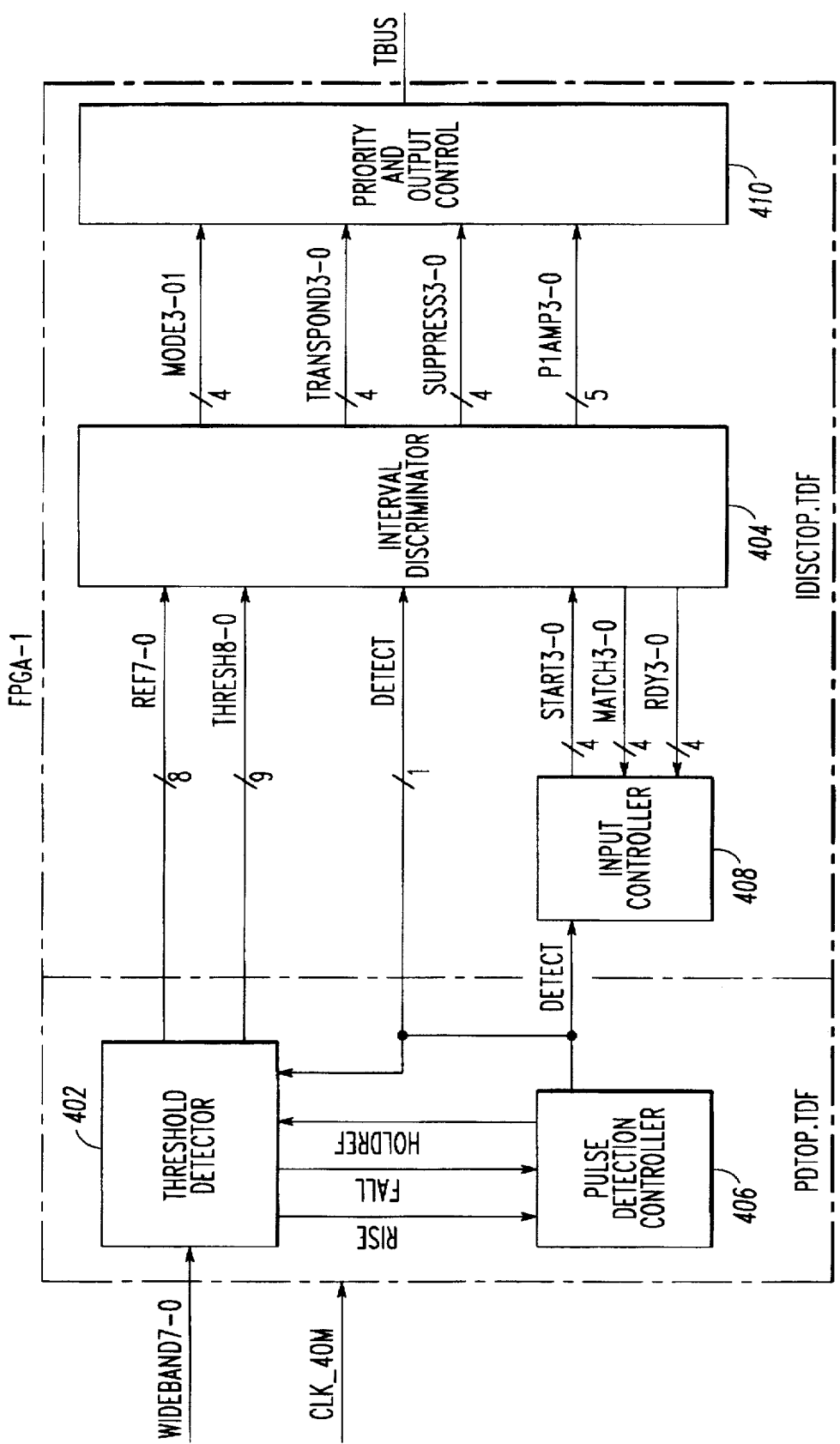
FIG. 9 is a block diagram of a configuration of a first field programmable gate array in the digital submodule.

FIG. 9 illustrates an example of how the FPGA1 206 may be configured for the ATCRBS application. A digital signal received by the FPGA1 206, in this example, an eight-bit wide band signal WIDEBAND7-0, is transmitted to a threshold detector 402 which generates a sample peak pulse amplitude signal REF7-0, in this example, an eight-bit signal, and a threshold signal THRESH8-0, a nine-bit signal.

The threshold detector 402 additionally generates a rise signal RISE when a midpoint of the rising edge of a pulse is detected and a fall signal FALL when a midpoint of the falling edge of the pulse is detected. The rise signal and fall signal are both supplied to a pulse detection unit 406.

When a valid pulse is detected, i.e., the pulse width and amplitude meet specified criteria, a detect signal DETECT is generated and supplied to the threshold detector 402, an interval discriminator unit 404 and an input controller 408.

Additionally, the pulse detector unit 406 provides a multiplexer control signal HOLDREF, requesting a multiplexer switch when the rising edge of a pulse has been detected and the falling edge of the pulse should next be detected. When the input controller 408 receives the DETECT signal, start signals START3-0 are generated. The input controller 408 also receives match signals MATCH3-0 and ready signals RDY3-0.

The sample peak pulse amplitude signal REF7-0 and the threshold signal THRESH8-0 are supplied to the interval discriminator unit 404 which has at least one interval discriminator 404a. In this embodiment for the ATCRBS application, four interval discriminators 404a–d are provided to account for a possibility of four interleaved pulses in pulse train interrogations within the wide band signal received WIDEBAND7-0.

Each interval discriminator 404a–d generates a respective match signal MATCH (MATCH3-0, respectively) indicating a pulse match has been detected and a respective ready signal RDY (RDY3-0, respectively) indicating whether the respective interval discriminator is in an idle state. Further, each interval discriminator 404a–d generates a mode signal MODE (MODE3-0, respectively) indicating the mode of matched pulses, a transpond signal TRANSPOND (TRANSPOND3-0, respectively) indicating a valid interrogation has been detected, a suppress signal SUPPRESS (SUPPRESS3-0, respectively) indicating the suppression condition has been met, and an amplitude signal P1AMP3-0 indicating detected amplitudes of P1 pulses, which are supplied to a priority/output control logic 410. Each P1AMP signal (P1AMP3, P1AMP2, P1AMP1 and P1AMP0, from the interval discriminators 404a–d, respectively) is a 5 bit signal indicating the respective detected amplitude of the respective P1 pulse.

The priority/output control unit 410 generates an output digital signal TBUS for transmission over the transpond bus 118.

Figure 10:
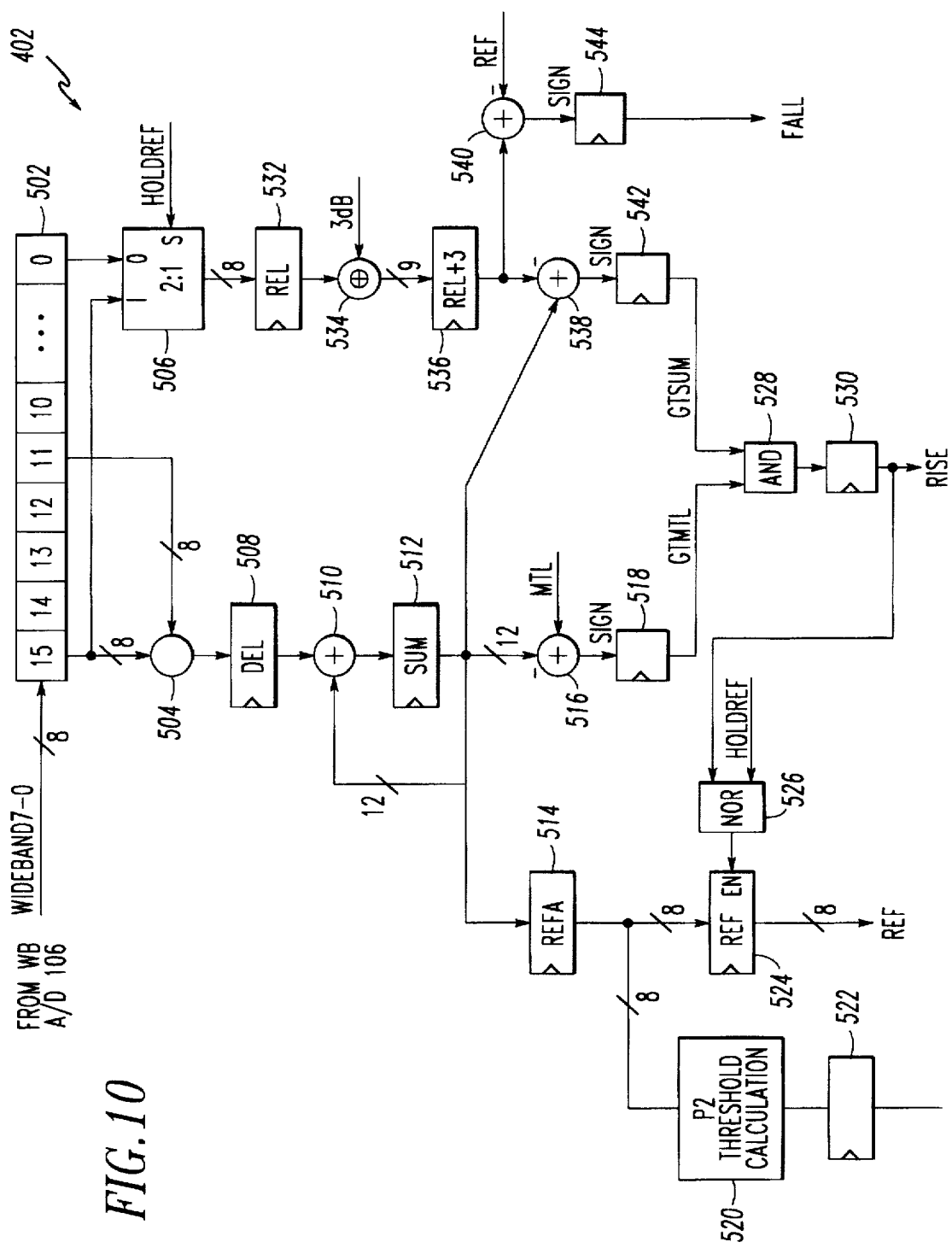
FIG. 10 is a block diagram of a threshold detector configured in the first field programmable gate array.

FIG. 10 illustrates the threshold detector 402 of FPGA1 206. The threshold detector 402 receives the WB signal from the SW 204. Since the pulses of the WB signal are, in this example, on the average, 0.8 microseconds wide and a 40 Mhz sampling rate is used, an average pulse is 32 samples wide. A 16 sample delay line, 502, is used to determine a time from a center of a pulse to each edge, i.e. rising edge and falling edge.

The threshold detector 402 thus compares an estimate of the amplitude of the center of the pulse to an amplitude of samples along the edges of the pulse. The estimate of the center, or peak, pulse amplitude is obtained by averaging four most recent samples. The averaging results in an estimate of the peak pulse amplitude that has a reduced variance relative to a single sample.

More specifically, a register chain 502, SUM value held in a register 512, DEL value held in a register 508, and REL value held in a register 532 and used for determining a value of register 536 are all initialized to zero. The first sample of 8 bits is received into register 15 of the register chain 502, register 11 is subtracted from register 15 (504) and a result is loaded into DEL 508. Contents of DEL 508 are then accumulated (510) into SUM 512. Since register 11 was initially zero, DEL 508 receives the data contained in register 15. When a second sample enters register 15, the first sample moves to register 14. DEL 508 will then receive register 14 minus zero (register 11). SUM 512 will thus contain a sum of the first two samples.

This process continues (with register 11 equalling zero) and consequently, the SUM 512 contains a sum of the first four samples. When a fifth new sample enters the register line 502, the first sample moves to register 11. Register 11 will now hold a sample value instead of an initialization value. Register 11 is subtracted from register 15 (504) to produce a difference which is added to SUM 512. SUM 512 now holds the sum of samples two through five.

This technique of adding the difference between the newest sample and the sample five samples old to SUM is used to keep a running sum of the four newest samples in SUM. This running sum is computed with one addition at adder 510 and one subtraction at subtractor 504. Since the running sum is a sum of four eight bit numbers, the running sum could require 10 bits for representation. A running sum signal SUM output from SUM 512 is 12 bits in the present embodiment to allow for averaging a greater number of samples in future designs; therefore, only 10 of the 12 bits output in this embodiment will be significant.

The SUM 512 and DEL 508 registers produce one clock delays and are needed, in this embodiment, to operate the FPGA1 206 at a high clock rate required.

The SUM signal is then transmitted back to the first adder 510, a third register REFA 514, a second adder 516 and a third adder 538.

The third register 514 registers the SUM signal and then transmits an 8-bit reference signal to a threshold calculator 520 and to a fourth register REF 524. The threshold calculator 520 calculates a threshold of a pulse and outputs the threshold signal THRESH8-0 to a fifth register 522 before output to the interval discriminator unit 404.

The fourth register 524 is enabled by an enable signal and outputs an 8 bit reference signal REF.

The second adder 516 subtracts the SUM signal from a constant threshold signal MTL to produce a first sign signal. The first sign signal is supplied to a sixth register 518 which outputs the sign signal GTMTL which indicates whether the sum is greater than a constant threshold value indicated by the constant threshold signal MTL.

The 2:1 multiplexer 506 receives the sample in register 15 and the sample from register 0 of the register chain 502. Based on the multiplexer switch signal HOLDREF, either the sample from the register 15 or the sample from register 0 is output as an 8 bit register signal. The register signal is supplied to a seventh register REF 532 and then to a fourth adder 534. The register signal and a 3 dB signal, which is, in this example, a half power point, are added to produce a 9 bit added signal. The added signal is supplied to a eighth register 536 which registers the added signal.

The added signal is then supplied to the third adder 538 which subtracts the added signal from the SUM signal to produce a second sign signal which is next supplied to a ninth register 542. The ninth register 542 outputs the second sign signal GTSUM indicating whether the added signal is greater than the SUM signal.

Both the first sign signal GTMTL and the second sign signal GTSUM are supplied to an AND gate 528 which produces a rise signal. The rise signal is transmitted to a flip-flop 530 and then output as the rise signal RISE, indicating whether a rising edge of the pulse has been detected. The rise signal is also supplied to a NOR gate 526 along with the multiplexer switch signal HOLDREF. The NOR gate 526 outputs the enable signal for enabling the fourth register REF 524.

The added signal is also supplied to a fifth adder 540 which subtracts the reference signal REF from the added signal and outputs a third sign signal. The third sign signal is then registered by an eleventh register 544 before being output as a fall signal FALL indicating that a falling edge of the pulse has been detected.

Figure 11:
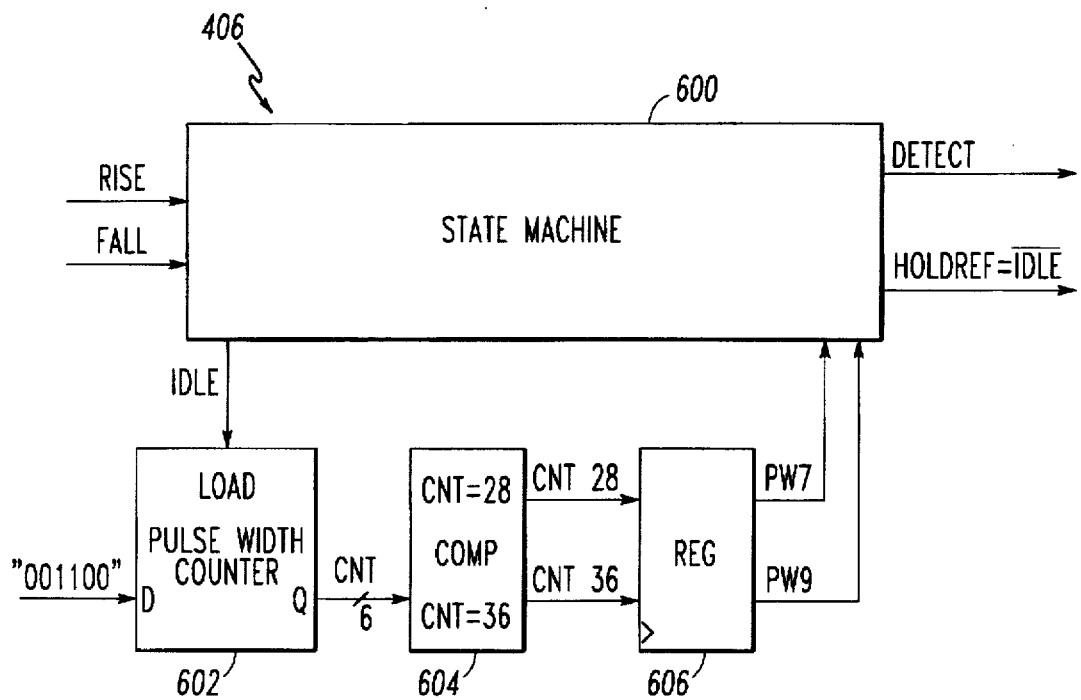
FIG. 11 is a block diagram of a pulse detector controller configured in the first field programmable gate array.

FIG. 11 is a block diagram of the pulse detector controller 406. A state machine 600 receives the rise signal RISE and the fall signal FALL from the threshold detector 402. The state machine 600 will detect a valid pulse based on predetermined criteria which may include pulse width and amplitude.

When a RISE signal is received, the state machine 600 outputs a multiplexer signal HOLDREF indicating that a possible pulse has been detected and a search for a falling edge of the pulse should begin.

When a new rising edge has not been detected, the state machine 600 will output an idle signal IDLE indicating that the state machine 600 is idle, to a pulse width counter 602. The six bit pulse width counter or timer 602 also receives a constant initialization value. The pulse width counter or timer 602 is in an initialization state when the state machine outputs the IDLE signal indicating that the state machine is idle. In this example, the state machine will output an active IDLE signal when the state machine is idle.

The pulse width counter begins counting after the RISE signal indicates a rising edge, in this example, the RISE signal goes active, which causes the state machine to exit the idle state.

A count value CNT of 6 bits is output to a comparator COMP 604. The comparator 604 compares the count value to two predetermined values, in this example, a value 28 and a value 36. If the count value is equivalent to 28 , a count 28 signal is output. Similarly, if the count value is equivalent to 36, a count 36 signal is output. A register 606 receives both the count 28 signal and the count 36 signal.

When the register 606 receives a count 28 signal indicating that the pulse width counter has reached 28, the register 606 outputs a pulse width 0.7 signal PW7 indicating that 0.7 microseconds has passed, thus opening a time window. When the register 606 receives a count 36 signal indicating that the pulse width counter has reached 36, the register 606 outputs a pulse width 0.9 signal PW9 indicating that 0.9 microseconds has passed, thus closing the time window. As previously described, in this example, an average pulse is 0.8 microseconds in pulse width and a valid pulse is from 0.7 microseconds to 0.9 microseconds in pulse width.

If the timer counts to 0.7 microseconds and receives the fall signal, indicating a falling edge of the pulse has been detected, before a 0.9 signal is output, then a valid pulse is indicated and the state machine 600 outputs a detection signal DETECT. In summary, the pulse width timer is used to determine if the delay from RISE to FALL is in a 0.7 μs to 0.9 μs range.

Additionally, when the state machine 600 is not in the idle state, i.e. a rising edge has been detected, the state machine outputs the switch multiplexer signal HOLDREF to hold the estimate of the pulse amplitude and switch the multiplexer operation to look for the falling edge.

Figure 12:
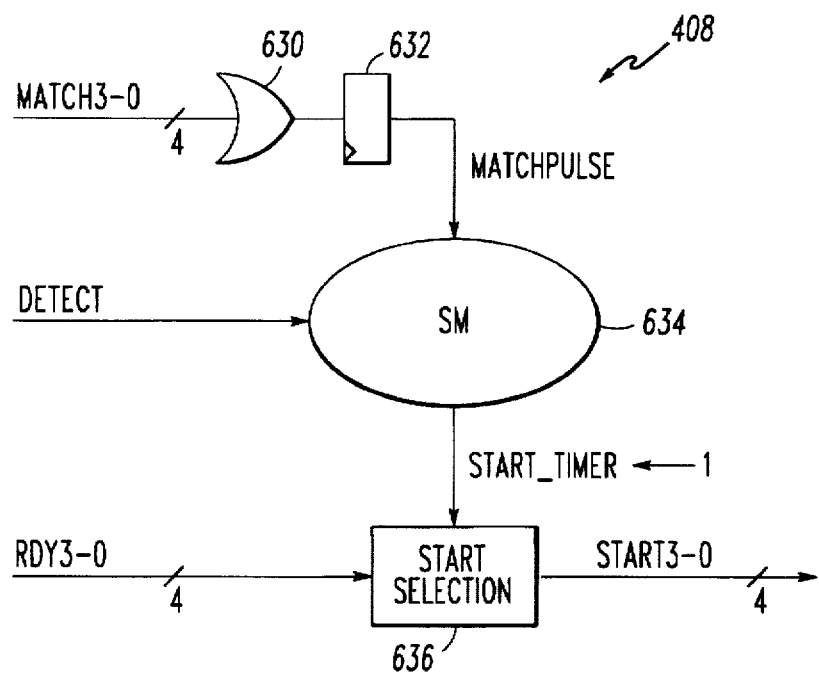
FIG. 12 is a block diagram of an input controller configured in the first field programmable gate array.

FIG. 12 illustrates the input controller 408 which receives the detection signal DETECT from the pulse detection controller 406. The input controller also receives the match signal MATCH3-0 from the interval discriminator unit 404. The match signal is a 4 bit signal, in this example, which includes a 1 bit signal from each of the four interval discriminators 404a-d. The 4 bit signal MATCH3-0 is supplied to an OR gate 630 and the result is then supplied to a register 632 which outputs a match pulse signal MATCH-PULSE indicating whether the detected pulse is a part of an interrogation started with a previously detected pulse.

The match pulse signal MATCHPULSE and the detect signal DETECT are supplied to a state machine 634. The state machine 634 will output a start timer signal START_TIMER in response to the DETECT signal which indicates when a pulse has been detected. The start timer signal START_TIMER requests a starting of one of the interval discriminators 404a-d in the interval discriminator unit 404. The start timer signal is supplied to a start selection unit START SELECTION 636 along with the ready signal RDY3-0, in this example, a 4- bit signal where each bit corresponds to one of the four interval discriminators 404a-d, respectively and indicates a state of the corresponding interval discriminator 404a-d.

The start selection unit 636 outputs a start signal START3-0 of 4 bits. When a start timer signal START_TIMER is received which requests a starting of one of the interval discriminators 404a-d, the start selection unit 636 determines, based on the ready signal RDY3-0, which interval discriminator 404a-d may be started and, outputs the start signal START3-0 indicating which interval discriminator should start the interval discrimination function.

When a match between two pulses received has been detected, i.e., a timing difference between when a first pulse is received and when a second pulse is received meets specific criteria set forth for operating in selected modes, no start selection is generated and the interval discriminator which has determined the match accepts the detection and processes it.

Figure 13:
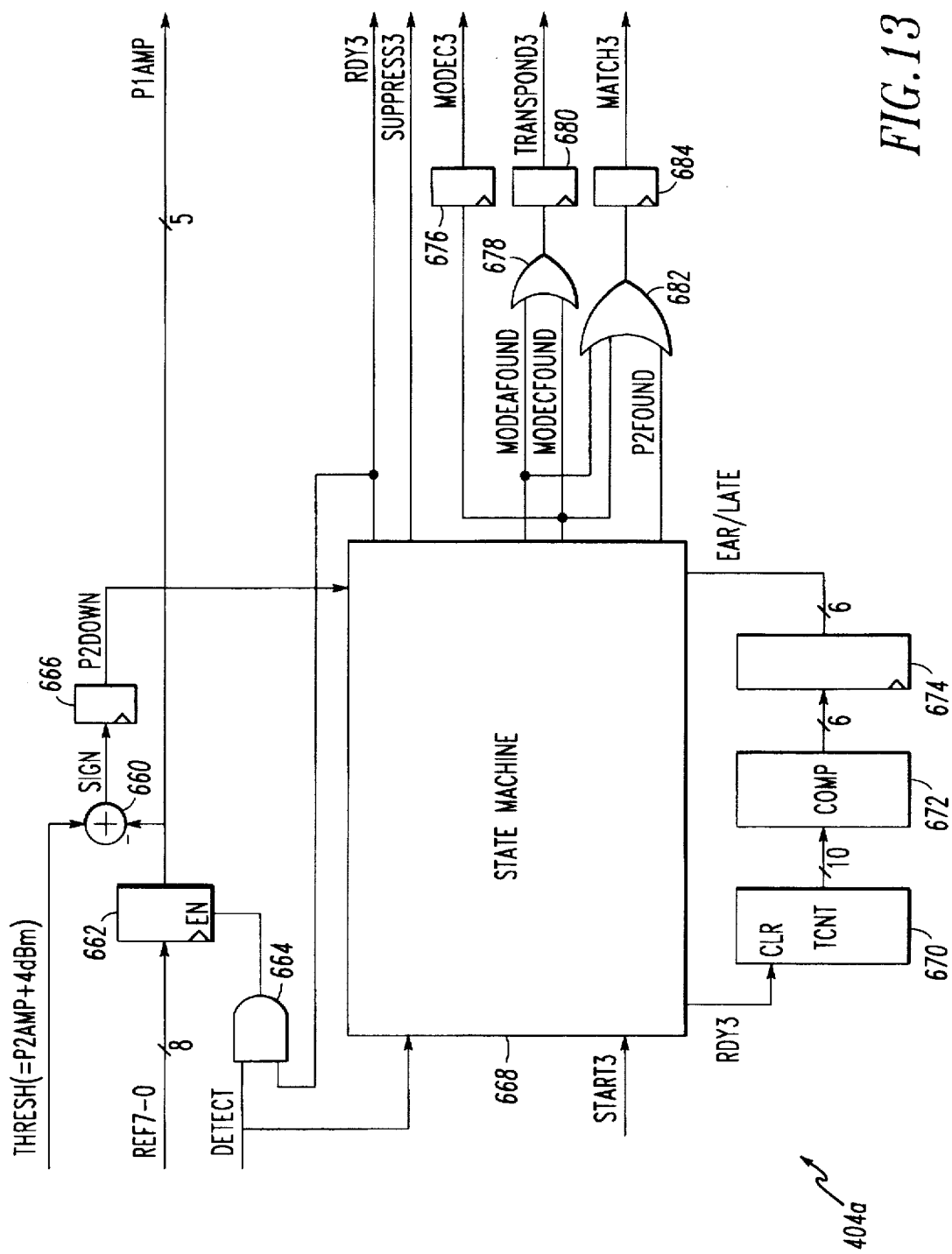
FIG. 13 is an example of one interval discriminator configured in the first field programmable gate array.

FIG. 13 is a block diagram of an example of one interval discriminator 404a, for example, of the present embodiment using four interval discriminators 404a-d in the interval discriminator unit 404. The interval discriminator 404a receives the 9 bit threshold signal THRESH8-0 signal and the 8 bit reference signal REF 7-0 from the threshold detector 402, the detection signal DETECT from the pulse detection controller 406, and a respective one bit START signal START3 of the start signal START3-0 from the input controller 408.

The threshold signal, which in this example represents the amplitude of the P2 signal plus 4 dBm, is supplied to an adder 660. The reference signal REF7-0 is supplied to a first register 662 which is enabled by an enable signal EN.

The detection signal DETECT is supplied to an AND gate 664 along with a ready signal RDY output from a state machine 668 in the interval discriminator 404a which produces an ANDED output. The ANDED output is supplied to the first register 662 as the enable signal EN. In response to the enable signal EN, the register 662 outputs a respective first pulse amplitude signal P1AMP3 of the first pulse amplitude signal P1AMP3-0. The first pulse amplitude signal P1AMP3 is supplied to the priority/output control unit 410.

Additionally, the first pulse amplitude signal P1AMP3 is supplied to the adder 660 which subtracts the first pulse amplitude signal P1AMP3 from the threshold signal THRESH8-0 and outputs a sign signal SIGN as a result. The sign signal SIGN is supplied to a second register 666 which outputs a second pulse down signal P2DOWN to the state machine 668.

The state machine 668 receives the detection signal DETECT, the respective one bit signal START3 of the start signal START3-0 and an early/late signal EAR/LATE. The state machine 668 generates a respective one bit ready signal, RDY3.

The state machine 668 determines whether a valid interval between two pulses exists, based on mode criteria, and then determines which mode the two pulses are operating under, based on the mode criteria. When the state machine 668 receives a start signal START3 from the input controller 408, the state machine 668 will, in this example, deactivate the ready signal RDY3 to indicate that the respective interval discriminator 404a is in an active state, i.e., has received a pulse.

A counter TCNT 670 receives the ready signal RDY3 and beings counting. A 10 bit count signal is output to a comparator COMP 672 which compares the count signal to each mode criteria. In this example, 3 modes are being utilized so 6 mode criteria are used by the comparator. More specifically, the count signal is compared to a Pulse 2 Early value, a Pulse 2 Late value, a Mode 3A Early value, a Mode 3A Late value, a Mode C Early value, and a Mode C Late value. A 6 bit mode comparison signal is output, each bit corresponding to a result of a comparison of the timer count signal TCNT with a respective mode criteria.

The mode comparison signal is supplied to a register 674 which then outputs a 6 bit early/late signal EAR/LATE, each bit representing whether a respective mode criteria has been met. The early/late signal is supplied to the state machine 668 which, based on the early/late signal determines if two received pulses are operating in one of the selected modes, in this example Mode A, Mode C, or a suppression pulse, P2.

The state machine 668 outputs the respective ready signal RDY3 to the input controller as one signal part of the four bit ready signal RDY3-0 when the state machine 668 is in the idle state. A respective suppress signal SUPPRESS3 is output when a suppress pulse is detected which has an amplitude greater than a selected amplitude, in this example (P1+4dB). The suppress signal SUPPRESS3 is supplied to the priority/output control unit 410 as one signal of the SUPPRESS3-0 signal.

A Mode C found signal MODECFOUND is output by the state machine 668 when an interval between two pulses is found to meet Mode C criteria. Similarly, a Mode A found signal MODEAFOUND is output by the state machine 668 when an interval between two pulses is found to meet Mode A criteria.

The Mode C found signal MODECFOUND is supplied to a third register 676 which outputs a Mode C signal MODEC to the priority/output control unit 410. Additionally, the Mode C found signal MODECFOUND and the Mode A found signal MODEAFOUND are supplied to a first OR gate 678. If either mode is indicated, the first OR gate 678 outputs a respective transpond signal TRANSPOND3, via a fourth register 680, to the priority/output control unit 410 indicating a valid interval has been detected. The Mode C found signal MODECFOUND and the Mode A found signal MODEAFOUND are further supplied to a second OR gate 682 along with a suppress pulse found signal P2FOUND. The second OR gate 682 outputs an OReD signal to a fifth register 684 which supplies a match signal MATCH3 to indicate whether Mode A or Mode C criteria are met and thus, that two pulses match. If a suppress pulse is found, the match signal MATCH3 is set to indicate a match and to indicate that the respective interval discriminator 404a may be restarted and cleared.

Figure 14:
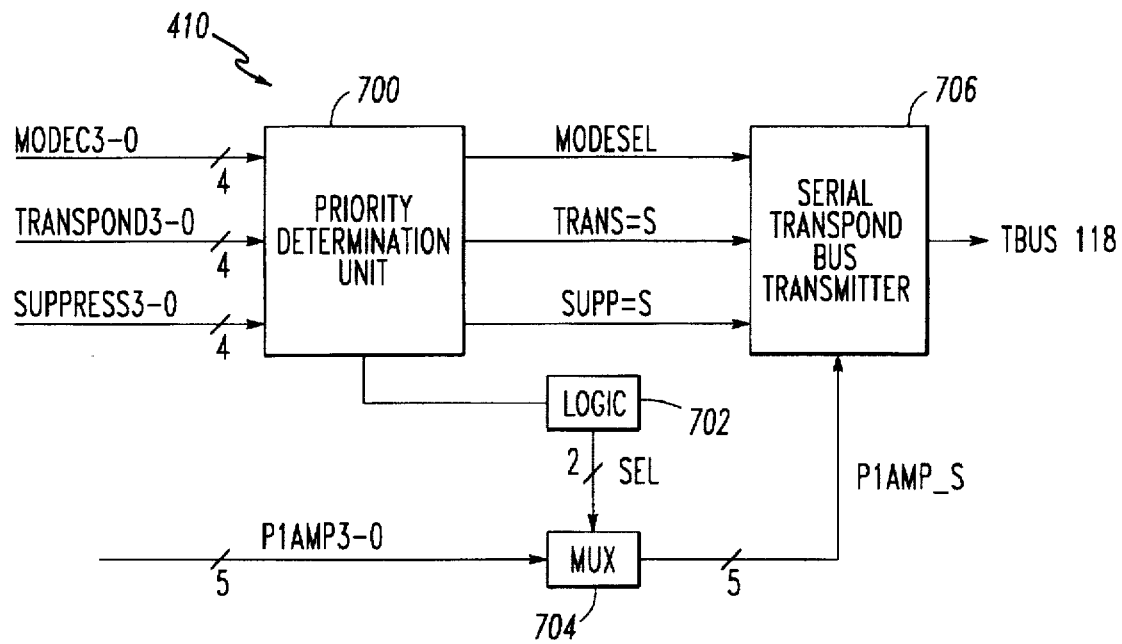
FIG. 14 is an example of a priority/output control unit configured in the first field programmable gate array.

FIG. 14 is a block diagram of the priority output control unit 410 which receives the 4 bit Mode C signal MODEC3-0, the 4 bit transpond signal TRANSPOND3-0 and the 4 bit suppress signal SUPPRESS3-0. Each interval discriminator 404a–d of the interval discrimination unit 404 supplies one bit for each of these signals. In addition, the priority output control unit 410 receives the 20 bit first pulse amplitude signal P1AMP3-0 which includes 5 bits from each interval discriminator 404a–d indicating the pulse amplitude of the first pulse associated with the respective interval discriminator.

A priority determination unit 700 receives the Mode C signal MODEC3-0, the transpond signal TRANSPOND3-0 and the suppress signal SUPPRESS3-0 and based on preselected criteria, assigns a priority of transfer of the signal. More specifically, the Mode C signal MODEC3-0, which in this example is only one bit from each respective interval discriminator since only two modes are being utilized, is supplied to indicate to which mode the pulses correspond. A priority of modes indicating an importance of each mode, can be preselected and, as is well known in the art, comparators or such may be used to give priority to a selected mode. The transpond signal TRANSPOND3-0 indicates when a valid interrogation has been detected, each bit representing a respective interval discriminator 404a–d and the suppress signal SUPPRESS3-0 indicates when the suppression state should be entered, each bit representing a respective interval discriminator 404a–d. Again, the priority determination unit 700 includes comparators preset to indicate which function, transpond or suppress, of a respective match of pulses or respective pulses, should be performed first and which interval discriminator 404a–d has priority.

The priority determination unit 700, in this example, generates a one bit mode signal MODE_SEL indicating the mode of operation, a one bit transpond signal TRANS_S indicating a transpond function and a one bit suppress signal SUPPR_S indicating a transpond function. Only one signal of the transpond signal TRANSPOND3-0 and the suppress signal SUPPRESS3-0 may be, in this example, active at a given time, i.e., either a transpond or suppress function may be performed but not both simultaneously.

Additionally, based on the preselected criteria, a priority of a transmission of the matched pulses is determined and the interval discriminator 404a–d which will transfer data is selected. A priority signal is output from the priority determination unit 700 to logic 702 which generates a selection signal SEL indicating which interval discriminator 404a–d is to transmit its P1 amplitude as indicated in the P1AMP3-0 signal. The selection signal SEL is provided to a multiplexer 704, in this example, a 4:1 multiplexer, which selects the respective first pulse amplitude signal P1AMP corresponding to the selected interval discriminator 404a–d. The 5 bit respective first pulse amplitude signal is then supplied to a transpond bus transmitter 706 formatted into, in this example, a 8 bit serial message on the transpond bus (TBUS) 118.

The 8 bits represent the mode signal MODE_S, the suppress signal SUPPR_S, the 5 bits of the first pulse amplitude signal P1AMP_S from the selected interval discriminator and a start bit. The 8 bit serial message is supplied to the transpond bus 118. The transpond signal TRANS_S is not supplied in the serial message since at this juncture, the transpond signal TRANS_S would be redundant.

DIGITAL SUBMODULE OF TRANSMITTER MODULE

Figure 15:
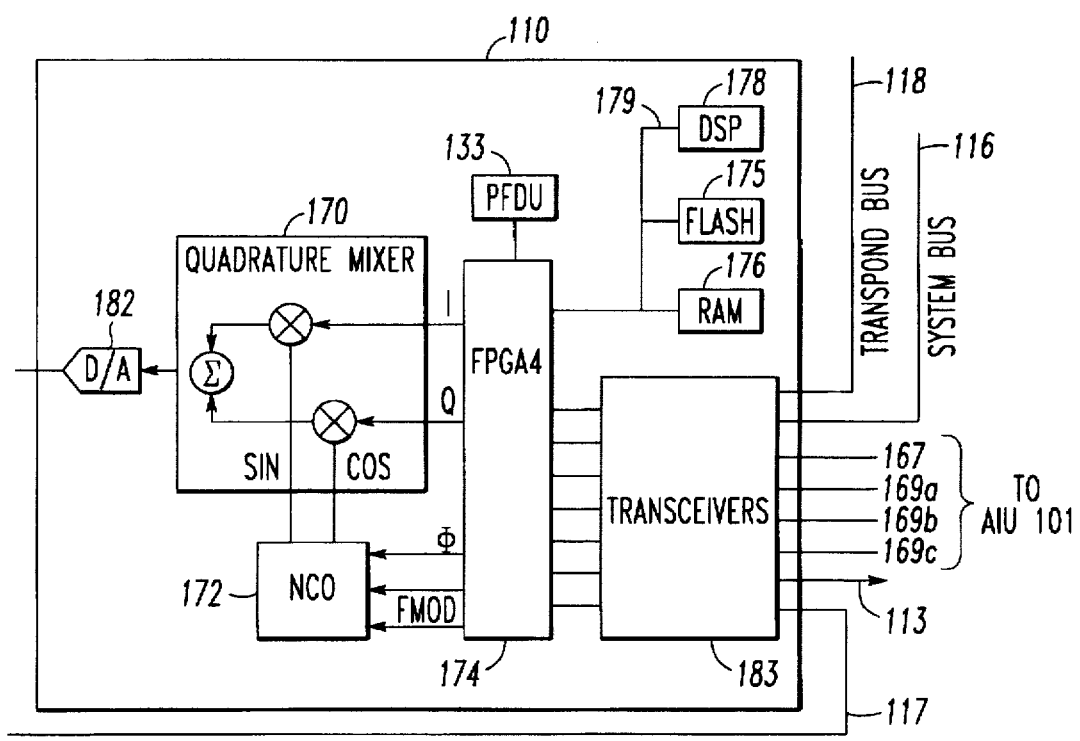
FIG. 15 is a block diagram of a digital submodule in a programmable common transmit module.

FIG. 15 is a block diagram of digital submodule 110 of the programmable common transmit module PCTM 102. As a general overview of the operation of the PCTM 102, 35 an information signal in a digital format is provided to a fourth field programmable array (FPGA4) 174 over the transpond bus 118. Further detail of the PCTM 102 can be found in the related disclosure COMMON TRANSMIT MODULE FOR A PROGRAMMABLE DIGITAL RADIO.

FPGA4 174 is reconfigurable for specific communication, navigation and identification (CNI) functions by loading data files into FPGA4 174, where the data files indicate the desired configuration. Thus, FPGA4 174 performs signal processing in accordance with the specific communication, navigation or identification (CNI) function formatted therein. For example, FPGA4 174 can be formatted to perform pulse coded modulation when functioning in ATCRBS.

FPGA4 174 can be configured by sending data files representing format data to FPGA4 174 over a conventional system bus 116 (such as a conventional RS 485) from an external computer 112, such as a communication, navigation and identification (CNI) controller (not illustrated, but described in related disclosure entitled DIGITALLY PROGRAMMABLE MULTIFUNCTION RADIO SYSTEM ARCHITECTURE), or conventional computer. However, the structure of the digital submodule 106 also permits FPGA4 174 to be reconfigured in a very short time (for example, 100 milliseconds) to perform a different type of radio communication without requiring a change in hardware and the accompanying tests. For example, a conventional non-volatile memory (NVM), such as a programmable flash memory FLASH 175, and a conventional random access memory RAM 176 are connected to a conventional local bus 179 to allow the flash memory FLASH 175 and the RAM 176 to interact with a digital signal processor DSP 178 and the FPGA4 174. Therefore, as illustrated in FIG. 15, DSP 178 is connected to FPGA4 174 via local bus 179.

Configuration of both the DSP 178 and the FPGA4 174 is set forth in detail in COMMON TRANSMIT MODULE FOR A PROGRAMMABLE DIGITAL RADIO, incorporated herein by reference.

Data files for configuring the FPGA4 174 for the ATCRBS application are generally transferred from the RAM 176 when the ATCRBS application is selected. The DSP 178 only needs to receive information over the system bus 116 to indicate that the ATCRBS application is selected before transferring configuration files to the FPGA4 174. As a result, the time to reconfigure the FPGA4 174 is reduced since data files do not have to be transferred over the system bus 116. Specifically, the microfiche includes a program which can be loaded into RAM 176 and run by DSP 178 to allow PCTM 102 to transmit ATCRBS signals.

Tuning and other frequency conversion operations performed in PCTM 102 include obtaining, from an external controller or computer 112 via the system bus 116, a specific frequency channel number or specific frequency in appropriate units (such as Hertz), as well as other information (such as WB or NB filter select); arithmetically calculating and, where needed, creating tuning commands in the DSP 178 for proportioning of tuning between a numerically controlled oscillator 172 and a tunable LO1 164 in the analog submodule 108 of the PCTM 102; reformatting the data in the FPGA4 174; and passing data to the numerically controlled oscillator 172. Also performed in the PCTM 102 is passing data to tunable LO1 164 in the analog submodule 108 via a tune bus 117 such that a control interface (control IF) 123, based upon the selected frequency band, provides control inputs to programmable dividers 2240 and 2232 (see FIG. 19) and an output divider select switch 2204 (see FIG. 19). Also, based upon the selected frequency band, a control interface 123 provides the proper control signals for switches in the analog submodule 108.

Similarly, tuning data as well as additional AIU control data received from the external controller or computer 112 (such as transmit signal distribution—e.g., either from an assigned transmit module or a spare transmit module) is processed in the DSP 178, reformatted in the FPGA4 174 and relayed to the associated AIU 103 via a transmit control bus 167 for control of filters, switches, etc. Also, the transmit control bus 167 (or a separate bus, if needed for bus traffic consideration) can be used to pass instantaneous modulation information to optimize the operating point, and thus the efficiency, of a power amplifier in the AIU 103.

Commands to the AIU 103 requiring a short time response are processed in the DSP 178 and, if necessary, reformatted in the FPGA4 174 and passed to the AIU 103 via discrete lines. For example, transponder top or bottom antenna selection signals can be sent to the AIU 103 via transmit discrete 169b. Pulse shape strobes can be sent to the AIU 103 via transmit discrete 169c for synchronization of modulator pulse output with additional pulse shaping (e.g., for TACAN gaussian pulses) that could be performed in an AIU power amplifier in the AIU 103. Not all of these example transmit discretes are necessarily used for every application, and the flexibility of the design permits the FPGA4 174 to be programmed for other interfaces, of either discrete functionality, or serial or parallel bus functionality.

The digital submodule 110 may include conventional transceivers 183, such as Model No. SN75ALS171, available from Texas Instruments. Via the transceivers 108, the system bus 116 connects the digital submodule 110 to external devices such as a conventional computer 112 containing a conventional serial interface 114 and a conventional sound card 120 (such as, for example, Model No. Soundblaster 16, available from Creative Labs). A conventional microphone (not illustrated) may also be connected to convert voice signals to electrical signals and provide the electrical signals to the sound card 120.

Also via the transceivers 183, the transpond bus 118 connects the digital submodule 110 of the PCTM 102 to the digital submodule 106 of the PCRM 100.

Generally, the transceivers 183 convert voltage levels of signals received from the transpond bus 118 and the system bus 116 to voltage levels required by the FPGA 174. The transpond bus 118 is used, as in ATCRBS applications, when transpond functions require transfer of information between the PCRM 100 and the PCTM 102. Thus, the serial digital data signal from the digital submodule 106 of the PCRM 100 is supplied to the digital submodule 110 of the PCTM 102 through the transceivers 183 from the transpond bus 118.

A portion of the FPGA4 174 is configured, in the present embodiment, to function as a conventional UART and thus provide an interface between the system bus 116 and the FPGA4 174. The FPGA4 174, in this example, is a conventional field programmable gate array (FPGA4), such as an EPF 81188 Field Programmable Gate Array available from Altera.

The FPGA4 174 also generates a control signal TCTRL via a tune bus 117, which includes a differential clock and a differential serial data stream, to the control interface 123 of the analog submodule 108. The control signal controls conversion variables of analog submodule 108. These conversion variables are parameters embedded in the DSP programs of each application.

Interpolated or formatted signals from the FPGA4 174 are sent to a conventional quadrature mixer 170, such as a Model No. STEL-1130, available from Stanford Telecom. A conventional numerically controlled oscillator 172, such as a STEL-1177 Numerically Controlled Oscillator, available from Stanford Telecom receives a frequency signal $f_0$ from FPGA4 174, where $f_0$ is the center frequency of the carrier. In response to the frequency signal $f_0$, the numerically controlled oscillator 174 produces a sequence of digital samples of the desired carrier signal. The numerically controlled oscillator 172 also performs phase and frequency modulation of the carrier, if desired. The digital oscillation signal is provided to the quadrature mixer 170.

The quadrature mixer 170 conventionally generates a digital waveform in accordance with in-phase (I) and quadrature (Q) signals received from FPGA4 174, and the digital oscillation signal received from the numerically controlled oscillator 172. Thus, the combination of the numerically controlled oscillator 172 and the quadrature mixer 170 form a modulator which produces a digitally modulated carrier signal. In this embodiment, the Stanford Telecom STEL-1130 Quadrature Mixer and the Stanford Telecom STEL-1177 Numerically Controlled Oscillator are utilized together to produce digitally modulated carrier signals in a conventional manner.

The digital modulated carrier signal produced by the numerically controlled oscillator 172 and the quadrature mixer 170 is supplied to a conventional digital-to-analog converter 182 (DAC), such as a Model No. AD9721, available from Analog Devices. The DAC 182 receives the digitally modulated carrier signal and converts the digitally modulated carrier signal to an analog modulated carrier signal 80. The analog modulated carrier signal 80 represents a first analog intermediate frequency (IF) signal and is provided to the analog submodule 108. The intermediate frequency of the analog modulated carrier signal is preferably at 10 Mhz. The FPGA4 174 also sends the control signal TCTRL via the tune bus 117, to the control interface 123 of analog submodule 108.

Figure 16:
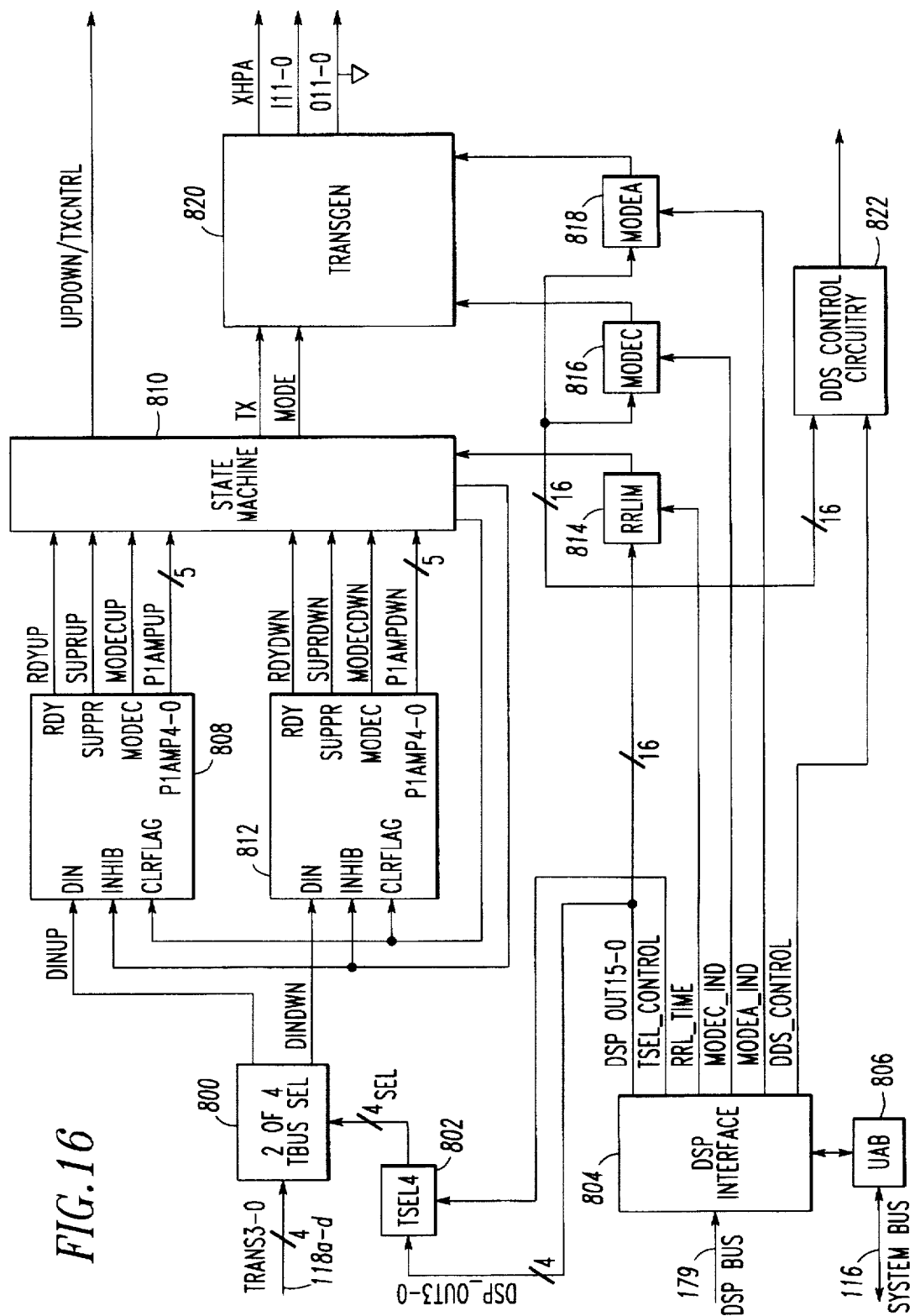
FIG. 16 is a block diagram of a configuration of the field programmable gate array in the programmable common transmitter module.

FIG. 16 is a block diagram of the FPGA4 174 in the PCTM 110 configured for the ATCRBS function. The FPGA4 174 receives at least one 8 bit serial digital data signal over the transpond bus 118. The FPGA4 174 may receive additional 8 bit serial digital data signals over additional and respective transpond buses 118n from other PCRMs 100n (not shown), as in the example PCTM 102 shown where FPGA4 174 receives four serial digital data signals. Such a configuration would be used for an application such as ATCRBS where an aircraft or other apparatus has more than one receiver or receive module for receiving information such as altitude and/or an identification code.

As one such example, an aircraft may have a first antenna on the top of the aircraft and a second antenna on the bottom of the aircraft. Each may pass the same information to two respective receivers. Each receiver, in this example PCRM 100n, would perform those functions detailed above and each PCRM 100n would supply a respective message over a respective transpond bus 118n. A single PCTM 102 would then determine which signal is stronger, i.e., perform diversity processing. The PCTM 102 would generate a reply to the antenna 101 that received the strongest interrogation signal.

More specifically, in the present invention, FPGA4 174 is coupled to four transpond buses 118a–d which transmit respective serial messages to produce a transpond signal TRANS3-0. A selector 800 selects two of the four transpond buses 118a–d from which to receive messages. The selector 802 receives a selector signal SEL, which in this example, is four bits, indicating which of the transpond buses to select and consequently, which signals (TRANS3, TRANS2, TRANS1 or TRANS0) to receive.

The selector signal SEL is output from a selection register TSEL 802 which receives four least significant bits DSP_OUT3-0 of an output signal DSP_OUT15-0 output from a digital signal processor (DSP) interface 804. In this example, the output signal DSP_OUT15-0 is 16 bits. The DSP interface 804 receives signals from the DSP 178 over the local bus 179. The selection register TSEL 802 is controlled by a selection control signal TSEL_CONTROL, also received from the DSP interface 804.

The DSP interface 804 is additionally coupled to a UART 806 which is coupled to the system bus 116. The UART 806 receives messages from the system bus 116 and converts the messages into an understandable format and transmits messages to the system bus 116 after converting the messages into an understandable format.

The DSP interface 804 outputs the DSP output signal DSP_OUT15-0, which in this example is 16 bits. The DSP interface 804 additionally outputs the selection control signal TSEL_CONTROL, a reply time signal RRL_TIME, a mode C indicator signal MODEC_IND, a mode A indicator signal MODEA_IND and a direct digital synthesis DDS control signal DDS_CONTROL.

The DSP output signal DSP_OUT15-0 is supplied to a reply rate limiter RRLIM 814 which is controlled by the reply time signal RRL_TIME. The RRL 814 limits the rate at which the PCTM 102 can generate replies.

The selector 800 supplies two signals, in this example, a digital up signal DINUP representing a digital message received from a top receiver of an apparatus, such as an aircraft and a digital down signal DINDWN representing a digital message from a bottom receiver of the apparatus. DINUP is supplied to a first receiver 808 and DINDWN is supplied to a second receiver 812. The receivers 808 and 812 each convert their respective received signals into parallel signals having parallel format.

Both receivers SERRCV 808 and 812 receive an inhibit signal INHIB and a clear flag signal CLRFLAG from the state machine 810. The inhibit signal notifies the receivers 808 and 812 not to output the parallel signals and the clear flag signal notifies the receivers 808 and 812 to clear their respective buffers.

The receiver 808 determines the suppress signal SUPPR, mode signal MODEC and pulse amplitude signal P1AMP of each 8 bit digital data signal received, in this case a serial signal, as was encoded by the PCRM 100 and outputs them as SUPRUP, MODECUP and P1AMPUP, respectively to the state machine 810. Additionally, the receiver 808 outputs a ready signal RDYUP indicating the serial digital data signal has been processed and is ready for transmission to the state machine 810.

Similarly, receiver 812 determines the suppress signal SUPPR, mode signal MODEC and pulse amplitude signal P1AMP of each 8 bit serial digital data signal received, as was encoded by the PCRM 106 and outputs them as SUPRDWN, MODECDWN and P1AMPDWN, respectively to the state machine 810. Additionally, the receiver 812 outputs a ready signal RDYDWN indicating the serial digital data signal has been processed and is ready for transmission to the state machine 810.

The state machine 810 determines which signal, the up signal or the down signal, is received and which is a stronger signal, based on predetermined criteria. If the signal is for suppression, the state machine will suppress the respective parallel signal in response to the respective suppress signal, SUPRUP or SUPRDWN. When one parallel signal is received, either P1AMPUP or P1AMPDWN, as indicated by RDYUP or RDYDWN, respectively, a reply by the PCTM 102 will be to the respective transmitter unless the other parallel signal is received simultaneously.

In this example, simultaneously is set to be within 125 nanoseconds. Therefore, if the up and down parallel signals P1AMPUP and P1AMPDWN are both received within 125 nanoseconds of each other, the state machine 810 will compare the parallel signals to determine which signal is stronger based on the amplitudes as indicated by amplitude signals P1AMPUP and P1AMPDWN. The reply will be to the antenna 101n (not shown) which has received the stronger interrogation signal.

The state machine 810 will thus output a control signal UPDOWN\TXCNTRL which indicates to which antenna to reply. Additionally, the state machine 810 outputs a transmission signal TX to indicate if a transpond generator TRANSGEN 820 should start transmitting and a mode signal MODE to indicate in which mode a transmission signal is responding.

The transpond generator of transpond generator circuitry 820 receives the TX and MODE inputs and generates an appropriate reply pulse train. The MODE signal is used to select one of two replies that were loaded into the MODEC and MODEA registers, 816 and 818. The TX signal is a real time pulse indicating that transmission should begin. The TX signal causes the data in the selected register, MODEC 816 or MODEA 818 to be sent over an I bus, I11-0. A Q bus is held at zero and the data is transmitted over the I bus to the quadrature mixer 170 to be modulated with a carrier generated by the NCO 172 to produce a modulated carrier signal. This modulated carrier signal is the reply required by the ATCRBS system in a digital form at a lower carrier frequency.

The XHPA signal is a control signal for the high power amplifier resident in the antenna interface unit. The DDS control circuitry 822 in the FPGA4 174 is used to set a desired carrier frequency, $f_o$ in the NCO 172. In the ATCRBS application the phase and frequency modulation control available on the NCO 172 are unused.

The modulated signal generated by the quadrature mixer 170 is transferred to the DAC 182 and an analog signal is generated. The analog signal generated is passed on to the analog submodule 108 for, in this example, conversion to a required carrier frequency.

ANALOG SUBMODULE OF PCTM

Figure 17:
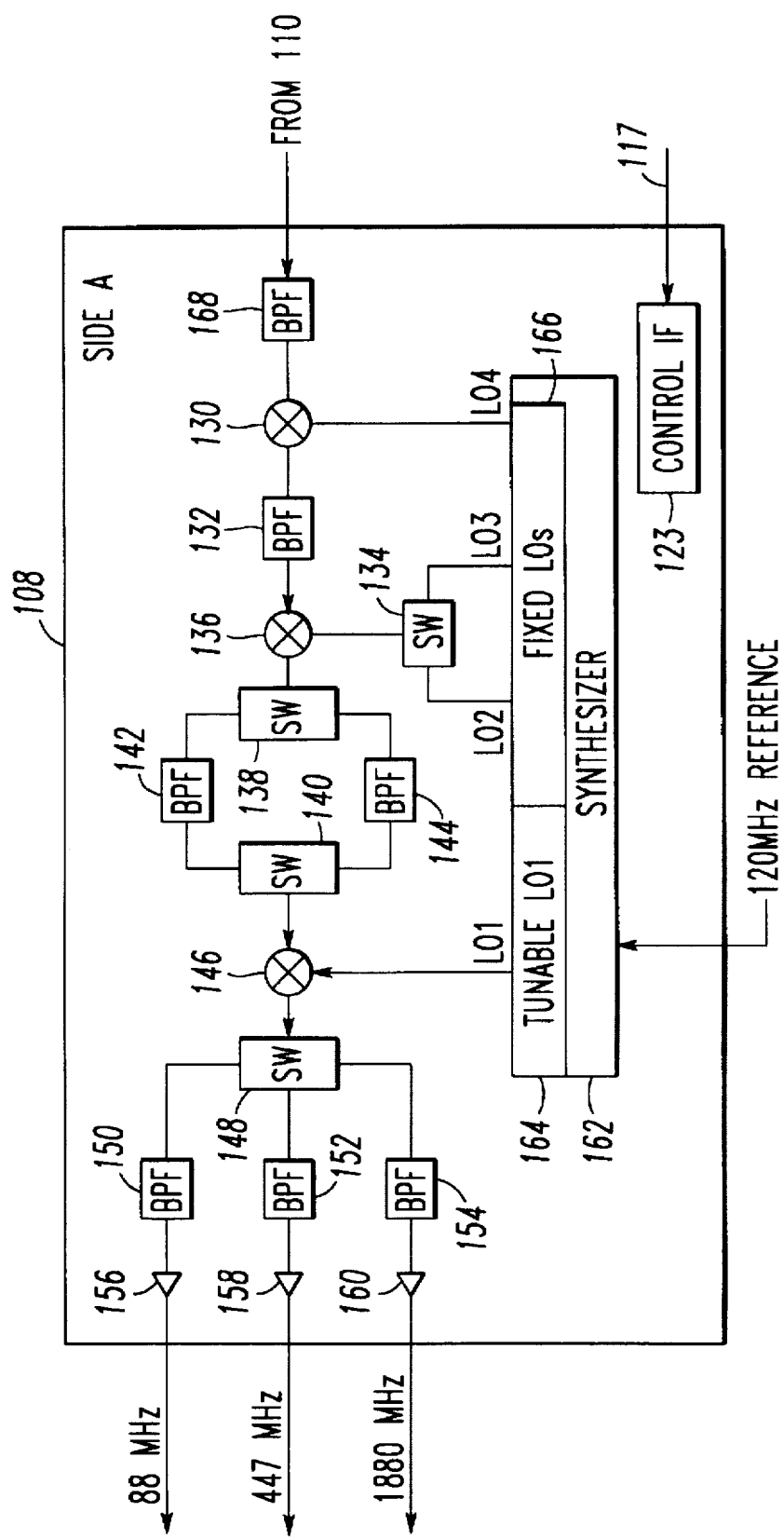
FIG. 17 is a block diagram of an analog submodule in the programmable common transmit module.

As illustrated in FIG. 17, a synthesizer 162 includes a tunable local oscillator (Tunable LO1) 164 to produce a first local oscillator signal LO1, and fixed local oscillators (Fixed LOs) 166 to produce a second local oscillator signal LO2, a third local oscillator signal LO3 and a fourth local oscillator signal LO4.

A first analog intermediate frequency signal produced by the digital to analog converter 120 is transferred from the digital submodule 110 and is received by a conventional bandpass filter (BPF) 168. BPF 168 passes WB signals at 10 Mhz, plus or minus 4 Mhz; however, BPF 168 can be a switched bandpass filter bank of filters for WB and NB signals. Thus, instead of being passed through BPF 168, the first analog intermediate frequency signal can be switched through, for example, either a first bandpass filter (not illustrated) which passes WB signals by passing signals at 10 Mhz plus or minus 4 Mhz, or a second bandpass filter (not illustrated) which passes NB signals by passing signals at 10 Mhz plus or minus 0.2 Mhz. The WB signal path is selected for ATCRBS and standard IFF.

In this example, BPF 128 passes WB signals of the first analog intermediate frequency signal to produce filtered first analog intermediate frequency signals.

Figure 18:
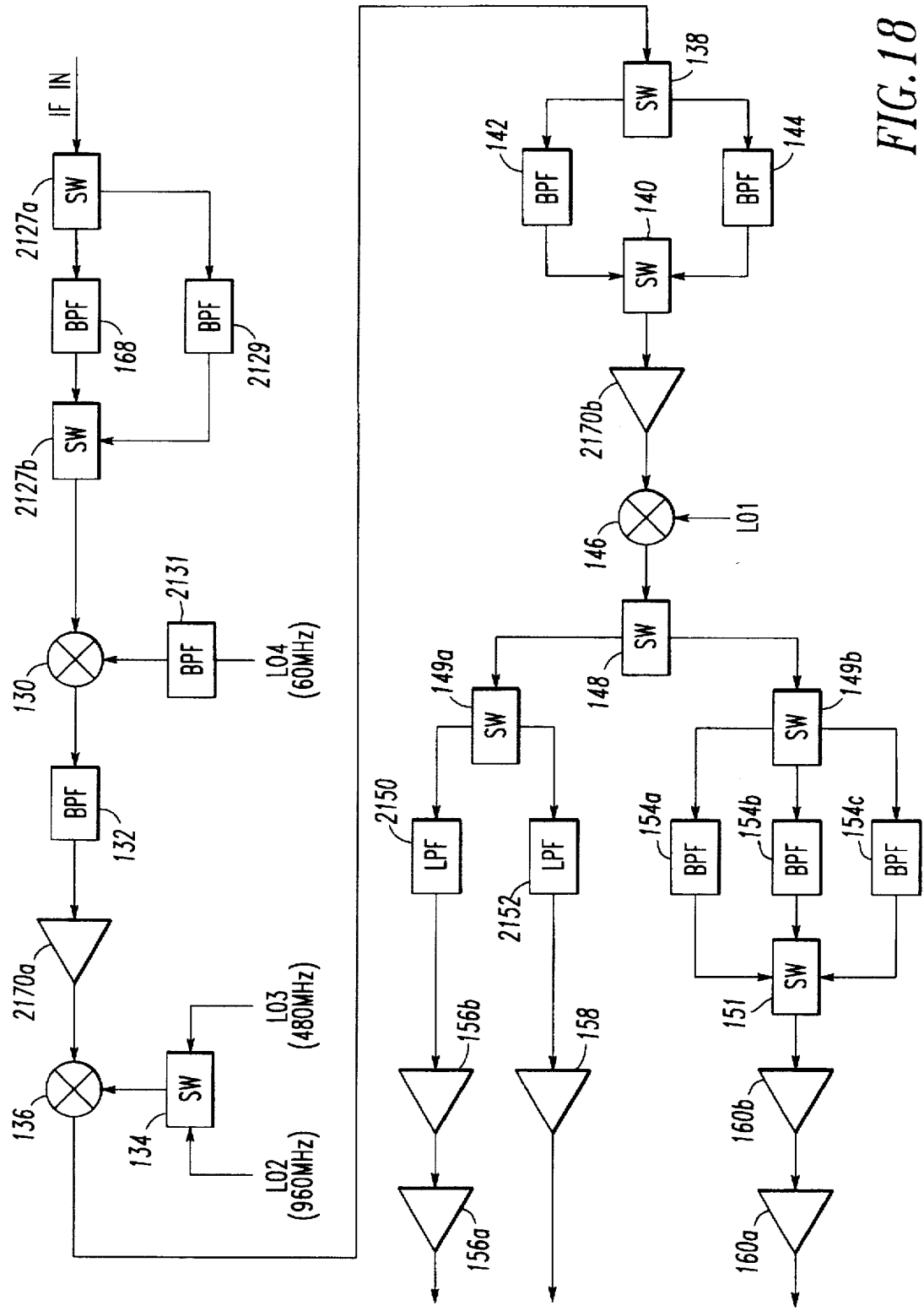
FIG. 18 is a more detailed block diagram of the analog submodule in the programmable common transmit module.

FIG. 18 is a more detailed block diagram of analog submodule 108 of PCTM 102, according to an embodiment of the present invention, illustrating additional switches and filters. Elements of FIG. 18 which correspond to elements of FIG. 17 are numbered similarly. The embodiment illustrated in FIG. 18 produces a transmission signal in the approximate range of 2 Mhz to 2000 Mhz, thereby allowing PCTM 102 to transmit different signals corresponding to different communication, navigation and identification (CNI) functions. As illustrated, switches (SW) 2127a and 2127b are used to select either bandpass filter (BPF) 168 or 2129. BPF 168 is used for wider bandwidth CNI functions and BPF 2129 is used for narrower bandwidth CNI functions. When the switches 2127a and 2127b are thrown to select the BPF 168, the BPF 168 passes analog signals 80 from the digital submodule 110 having frequencies, for example, between a low frequency (FL) equal to or less than 6 Mhz and a high frequency (FH) equal to or greater than 14 Mhz. Thus, in this example, the BPF 168 is centered at 10 Mhz and passes signals which are at least ±4 Mhz of a center frequency of the analog signal 80.

Switches 2127a and 2127b can also be thrown to select the bandpass filter (BPF) 2129. The BPF 2129 is centered on 10 Mhz and passes frequencies for narrow band CNI functions. The bandwidth of the BPF 2129 can be tailored to pass a range of radio channels for various CNI radio functions while rejecting Digital/Analog (D/A) harmonics associated with generation of the first intermediate frequency associated with those functions. A bandwidth of the BPF 2129 (or any other filter employed in a switched filter bank at this point) is generally based on the smallest bandwidth determined, a bandwidth of the widest bandwidth signal to be passed, a frequency step size of tunable signal LO1 in a corresponding band of interest and a frequency drift of the filter itself over the environmental extremes. The smallest bandwidth of the BPF 2129 (or any other filter employed in a switched filter bank at this point) over environmental extremes must be at least as great as a sum of twice a frequency stability of the first intermediate frequency.

If so desired, additional filters can be added via additional switching, or a variable bandwidth filter can be added, to more finely tailor a filter response to characteristics of desired plus unwanted signals out of the DAC 182.

Moreover, as illustrated in FIG. 18, a final converted signal produced by a third mixer 146 is switched by conventional switches 148, 149a, 149b and 151 to one of conventional lowpass filter (LPF) 2150 or 2152, and one of conventional bandpass filter (BPF) 154a, 154b or 154c to filter the final converted signal and produce a filtered final converted signal. Conventional medium-power amplifiers 156a, 156b, 158, 160a and 160b are connected to LPFs 2150 and 2152, and BPFs 154a, 154b and 154c to amplify the filtered final converted signal. Amplifiers 156a, 156b, 158, 160a and 160b, the LPFs 2150 and 2152, and the BPFs 154a, 154b and 154c are selected in accordance with a desired output transmission frequency. In addition, amplifiers 156a, 156b, 158, 160a and 160b are preferably operated well within their respective linear operating ranges.

In FIG. 18, the various filters and oscillator signals are switched so that an output of amplifier 156a is in an approximate 1.5–88 Mhz range, an output of amplifier 158 is in an approximate 88 Mhz-447 Mhz range, and an output of amplifier 160a is in an approximate 824–1880 Mhz range. An amplified filtered final converted signal is output from either amplifier 156a, 158 or 160a and is then routed to an antenna interface module (103-2 in FIG. 2). The antenna interface module 103-2 may further filtered and amplify the amplified filtered final converted signal to a required power level, if desired or if the radio function requires. The LPFs 2150 and 2152 and the BPFs 154a, 154b and 154c can be relatively wide band since they are provided mainly to filter out harmonic and other out-of-band interferences created as a result of mixing performed during IF conversion to the carrier frequency.

The intermediate power amplifiers 156a, 156b, 158, 160a and 160b are relatively high level amplifiers that maintain a high degree of linearity for an intermediate power signal (e.g., zero milliwatts) ultimately passed to an appropriate AIU for higher power amplification.

An alternate embodiment eliminates the circuitry following the mixer 146 and passes an output of the mixer 146 directly to an appropriate AIU which performs associated filtering and intermediate power amplification. In this case, additional isolation of a lower level output signal from extraneous signals should be provided.

BPF 132 passes frequencies between a low frequency of 65 Mhz and a high frequency of 75 Mhz. BPF 142 passes frequencies between a low frequency of 405 Mhz and a high frequency of 415 Mhz. BPF 144 passes frequencies between a low frequency of 885 Mhz and a high frequency of 895 Mhz.

Although the bandwidth of these filters are given for illustration purposes, their bandwidth and selectivity are easily selected or altered by those of skill in the art to adequately reject extraneous signals produced by nonlinearities in various elements such as mixers and amplifiers specifically implemented. Moreover, particularly for transponder functions like ATCRBS and IFF, temporal responses of the filters are chosen to meet transponder delay requirements. Such requirements may require wider pass bands than set forth in the preceding example.

Transmission of signals in the frequency range of 824 Mhz to 1880 Mhz is switched through one of the BPFs 154a, 154b or 154c (which are collectively represented by BPF 154 in FIG. 17). LPF 2150, used for an output frequency range 1.5-88 Mhz, passes all frequencies below at least 88 Mhz. LPF 2152, used for an output frequency range 88-447 Mhz, passes all frequencies below at least 447 Mhz. Generally, in this application, lowpass filters are used instead of bandpass filters because lowpass filters have lower delay. In addition, since lowpass filters do not transmit adverse extraneous signals in the lower portion of the frequency range, lowpass filters are generally adequate.

BPF 154a passes frequencies in a 824 Mhz to 1150 Mhz range, BPF 154b passes frequencies a 1150 Mhz to 1660 Mhz range, and BPF 154c passes frequencies in a 1660 Mhz and 1880 Mhz range. A conventional switch 149a selects either LPF 2150 or BPF 2152 and a conventional switch 149b selects one of BPF 154a, BPF 154b and BPF 154c. Conventional amplifiers 2170a and 2170b provide adequate signal amplification and conventional amplifiers 156a, 156b, 158, 160a and 160b provide adequate linear signal amplification. For ATCRBS and standard IFF applications, switches 148, 149b and 151 pass an output signal from mixer 146 through BPF 154a to amplifiers 160b and 160a.

As illustrated in FIG. 18, the second local oscillator signal LO2 is approximately 960 Mhz, the third local oscillator signal is approximately 480 Mhz and the fourth local oscillator signal is approximately 60 Mhz (for ATCRBS and standard IFF, switch 134 selects the LO3 signal of 480 Mhz).

Figure 19:
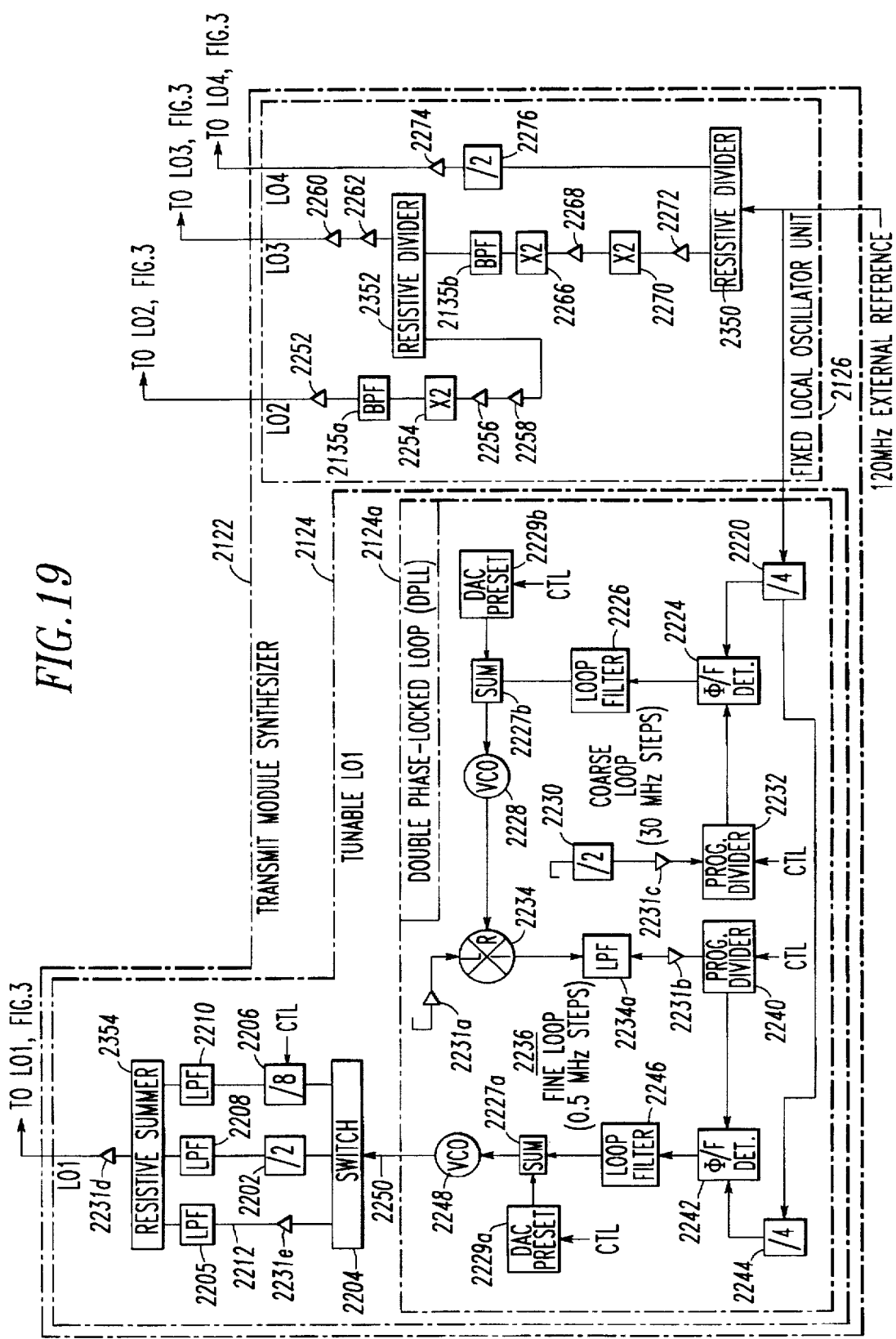
FIG. 19 is a block diagram of a synthesizer of the analog submodule in the programmable common transmit module.

As shown in FIG. 19, a BPF 2135a filters a second local oscillator signal, a BPF 2135b filters a third local oscillator signal and as shown in FIG. 18, 2131 filters a fourth local oscillator signal. The first local oscillator signal (LO1) is a tunable local oscillator signal and is selected from the following Table I in accordance with a desired RF output frequency, which is, for example, 1090 Mhz for the standard ATCRBS and IFF response.

TABLE I

| IF OF THIRD INTERMEDIATE Frequency signal | RF OUTPUT | LO1 | DIVISION RATIO | DPLL | OUTPUT OF SWITCH 134 |
|---|---|---|---|---|---|
| (410) | 1.5–88 | 408.5–322 | 8 | 3268–2576 | 480 |
| (890) | 88–447 | 978–1337 | 2 | 1956–2674 | 960 |
| (410) | 824–1150 | 1234–1560 | 2 | 2468–3120 | 480 |
| (890) | 1150–1660 | 2040–2550 | 1 | 2040–2550 | 960 |
| (410) | 1660–1880 | 2070–2290 | 1 | 2070–2290 | 480 |

In Table I, the DPLL column lists output frequencies of a double phase locked loop (DPLL) illustrated in FIG. 19. The division ratio column indicates a division ratio which divides the DPLL output, thereby producing LO1. The division ratio is selected by switch 2204 and by turning dividers 2202 and 2206 on or off.

Moreover, the frequency range of the first local oscillator signal LO1 and the oscillator signal selected by switch 134 (FIG. 18) is readily determinable from TABLE I and FIG. 18. For a standard ATCRBS and IFF example, when the desired RF output is in the range of 824 Mhz to 1150 Mhz, as illustrated by TABLE I, switch 134 selects the third local oscillator signal LO3 (approximately 480 Mhz) so that the third intermediate frequency signal output by second mixer 136 has a frequency of approximately 410 Mhz. Additionally, switch 2204 is selected and divider 2206 is turned off such that divider (12) 2202 is selected and the first local oscillator signal LO1 is tuned to be in the range of 1234 Mhz to 1560 Mhz. Specifically for standard ATCRBS and IFF, the DPLL is tuned to approximately 3000 Mhz and the LO1 output is 1500 Mhz.

Therefore, various switches in the analog submodule 108 are controlled so that appropriate local oscillator signals and appropriate BPFs are selected to produce a required final converted signal. This control of switches is readily understandable by a person skilled in art and similar switch control is illustrated, for example, in the related disclosure entitled "COMMON TRANSMIT MODULE FOR A PROGRAMMABLE DIGITAL RADIO" which also discusses analog submodule 108 in more detail.

FIG. 19 is a block diagram of a frequency synthesizer 2122, according to an embodiment of the present invention. The frequency synthesizer 2122 includes a tunable LO1 2124 and a fixed local oscillators 2126. The tunable local oscillator LO1 2124 is a conventional double phase-locked loop (DPLL) synthesizer with conventional output frequency divider circuits 2202 and 2206, and a straight-through path (i.e., no frequency division) 2212. A reference signal of 120 Mhz is input to a conventional divide-by-four circuit 2220, where the result is compared in a conventional phase-frequency detector 2224 to a fed-back signal to produce a comparison signal. The comparison signal passes through a conventional loop filter 2226 to a conventional voltage controlled oscillator 2228. The conventional voltage controlled oscillator synchronizes a stronger signal generated by the voltage controlled oscillator 2228.

From the voltage controlled oscillator 2228, a portion of the signal is passed through a conventional divide-by-two circuit 2230 and a conventional programmable divider 2232 to supply the fed-back signal. The remainder of the signal from the voltage controlled oscillator 2228 passes to a conventional mixer 2234 in a fine loop 2236, which mixes the remainder of the signal with a portion of the output 2250 of DPLL 2124a.

One sideband is passed to a conventional programmable divider 2240 and then to a conventional phase/frequency detector 2242. The sideband is next compared to a signal related to a reference signal, as processed by conventional divide-by-four circuits 2220 and 2244 and a result is output. The result passes through a conventional loop filter 2246 and synchronizes a conventional voltage controlled oscillator 2248, to provide an output signal 2250 of the DPLL 2124a.

A conventional switch 2204 is controlled to switch the output signal 2250 through frequency divider circuits 2202 and 2206, or through the straight-through path 2212. Dividers 2202 and 2206 can also be turned on or off. Signals travelling along the straight-through path 2212 and frequency divider circuits 2202 and 2206 are fed to a conventional resistive summer 2354 to produce LO1.

FIG. 19 also illustrates various conventional lowpass filters (LPFs) 2205, 2208 and 2210, conventional bandpass filters (BPFs) 2135a and 2135b, and conventional amplifiers 2231a, 2231b, 2231c, 2231d, 2231e, 2252, 2256, 2258, 2260, 2262, 2268, 2274 and 2272.

The second, third and fourth local oscillator signals LO2, LO3 and LO4 are derived from a 120 Mhz reference signal. For example, as previously described, the fourth local oscillator signal LO4 is, in this example, 60 Mhz. Thus, the fourth local oscillator signal LO4 is formed by passing the 120 Mhz reference signal through a conventional resistive divider 2350 and to a conventional divide-by-two circuit 2276. The third local oscillator signal LO3 is 480 Mhz and is formed by passing the 120 Mhz reference signal through a multiply-by-four circuit formed by two conventional multiply-by-two circuits 2270 and 2266.

The second local oscillator signal LO2 is 960 Mhz and is formed by passing the 120 Mhz reference signal by a multiply-by-eight circuit formed by the two multiply-by-two circuits 2270 and 2266 and a resistive divider 2352 combined with an additional, conventional multiply-by-two circuit 2254. Although not illustrated, but obvious to persons skilled in the art, a summing network, as related in the related disclosure "COMMON TRANSMIT MODULE FOR A PROGRAMMABLE DIGITAL RADIO", may be added between a loop filter 2246 and a VCO 2248, as well as between a loop filter 2226 and a VCO 2228, to sum in a predetermined control voltage steps such as through a digital to analog converter (DAC) to increase switching speed.

Also obvious to persons skilled in the art is manipulation of various division ratios in various circuit elements, dependent upon the available programmable division ratios, to reduce step size granularity and reduce phase noise in the coarse and fine loops. In this manner, the second, third and fourth local oscillator signals LO2, LO3 and LO4 are preferably derived from the same reference as the tunable first local oscillator signal LO1. Details of a synthesizer, a tunable local oscillator and formation of fixed local oscillator signals, as illustrated in FIG. 19, are discussed in related disclosure entitled "WIDE BAND RADIO-FREQUENCY CONVERTER HAVING MULTIPLE USE OF INTERMEDIATE FREQUENCY TRANSLATORS" and in the related disclosure entitled "COMMON TRANSMIT MODULE FOR A DIGITALLY PROGRAMMABLE RADIO".

Selection of frequencies is controlled by the FPGA 174 in the digital submodule 110, which transmits a control signal to the synthesizer 162, via the tune bus 117. With this control signal, the FPGA 174 instructs the synthesizer 162 to tune to the appropriate frequency for the first local oscillator signal LO1.

Figure 20:
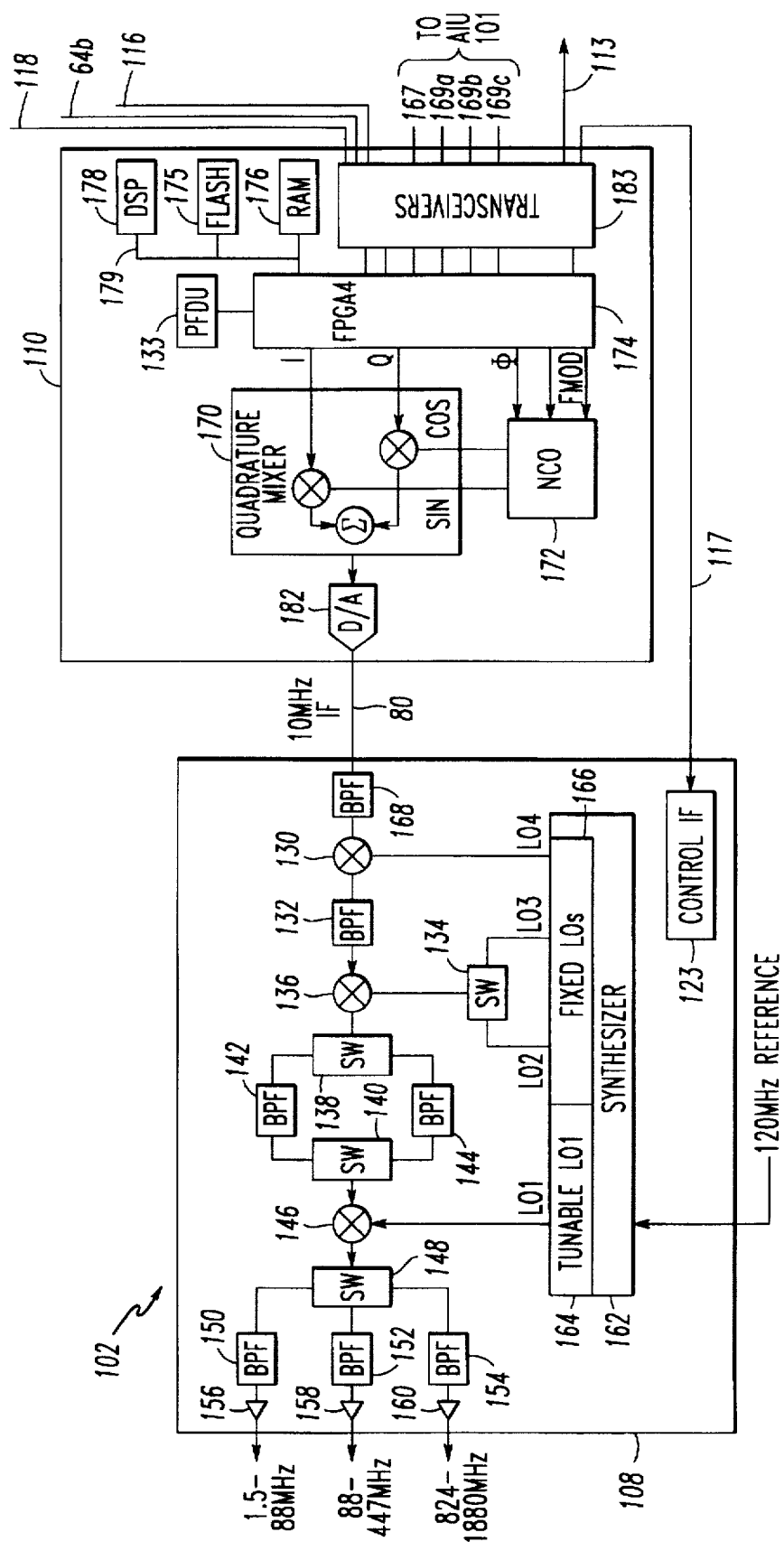
FIG. 20 is a block diagram of the programmable common transmit module.

An Air Traffic Control Radar Beacon System (ATCRBS), as well as standard IFF, transmits signals of approximately 1090 Mhz. FIG. 20 illustrates the signal flow through the analog submodule 108 when the PCRM 102 is programmed to transmit ATCRBS signals. The first analog intermediate frequency signal produced by the DAC 182 in the digital submodule 110 is centered at approximately 10 Mhz. Switches 2127a and 2127b as illustrated in FIG. 18, are controlled to allow the first analog intermediate frequency signal to pass through BPF 168. First mixer 130 receives the filtered first analog intermediate frequency signal and the fourth local oscillator signal LO4 (60 Mhz), and produces a corresponding second analog intermediate frequency signal centered at approximately 70 Mhz. The second analog intermediate frequency signal passes through BPF 132, amplifier 2170a and is received by second mixer 136. Since an ATCRBS transmission signal is at approximately 1090 Mhz, TABLE I, above, indicates that switch 134 selects LO3 at 480 Mhz. Therefore, the second mixer 136 mixes the second analog intermediate frequency signal with LO3, in accordance with TABLE I, to produce a third analog intermediate frequency signal. As a result, the third analog intermediate frequency signal is at approximately 410 Mhz.

The third analog intermediate frequency signal is passed through BPF 142 by appropriately controlling switches 138 and 140. As previously discussed, the BPF 142 passes signals in the approximate range of 405–415 Mhz. From BPF 142, the signal passes through amplifier 2170b and is received by the third mixer 146. The third mixer 146 also receives LO1. As indicated by TABLE I for ATCRBS transmission signals at approximately 1090 Mhz, LO1 is controlled to be approximately 1500 Mhz by selecting the division ratio equal to "two" (see frequency divider circuit 2202 in FIG. 19). Therefore, the third mixer 146 mixes the third analog intermediate frequency signal at approximately 410 Mhz with LO1 which is approximately 1500 Mhz, to produce a final converted signal of approximately 1090 Mhz. Switches 148, 149b and 151 are then controlled to route the final converted signal through BPF 154a (passing signals in the range of 824–1150 Mhz), in accordance with a specific frequency of the final converted signal.

The final converted signal then passes through switch 151, amplifiers 160b and 160a, and is routed to an antenna interface unit (AIU) 103-2.

By the preceding structure, an AIR TRAFFIC CONTROL RADAR BEACON SYSTEM can be achieved which performs efficiently and accurately within a programmable common receive module and a programmable common transmit module.

A programmable common radio according to the present invention has the following advantages.

Radio frequency signals corresponding approximately to 2–2000 Mhz can be input and a relatively low speed serial bit stream may be output by the programmable common receive module.

The programmable common radio may be programmable to receive and demodulate many CNI radio functions including interrogation functions, and the digital submodule may be included in a same box with the analog submodule for both the programmable common receive module and the programmable common transmit module, which may be, for example, a plug-in module of a small size. Further electrical isolation of the digital submodule from the analog submodule may be achieved.

The digital submodules include programmable FPGAs and signal processors for performing a variety of signal processing functions. Additionally, the digital submodule of the programmable common receive module can handle pulse trains operating in different modes, such as Mode C and Mode 3A.

The digital radio is functionally designed for minimal hardware although it may be appreciated that higher levels of integration are possible to reduce size even further. In addition, ASICs need not be used to achieve the structure and function of the programmable digital radio.

The present invention provides identification functions in a system which is easily programmable for various types of radio communications, while traditional systems use fixed function analog circuitry and cannot be reprogrammed.

Although a few preferred embodiments of the invention have been shown and described, it will be appreciated by those skilled in the art that changes may be made in these embodiments, without departing from the principles and spirit of the invention, the scope of which is defined in the claims and their equivalents.

What is claimed is:

1. A transponder comprising:
    a programmable receive module for processing a received interrogation signal into a transponder signal,
    said programmable receive module including at least one receive field programmable gate array, reconfigurable in accordance with first configuration data, for processing the received interrogation signal in one of a plurality of interrogation modes specified by the first configuration data to provide the transponder signal; and
    a programmable transmit module, coupled to said programmable receive module, for processing the transponder signal to generate and transmit a response signal.

2. The transponder of claim 1, wherein said programmable transmit module comprises a transmit field programmable gate array, reconfigurable in accordance with second configuration data, for processing the transponder signal into the response signal in the corresponding one of the plurality of interrogation modes specified by the second configuration data.

3. The transponder of claim 2, wherein said programmable transmit module further comprises:
    a memory for storing the second configuration data; and
    processing means, coupled to said memory, for reconfiguring said transmit field programmable gate array in accordance with the second configuration data.

4. The transponder of claim 1, wherein the plurality of interrogation modes comprise communication, navigation and identification modes.

5. The transponder of claim 4, wherein the plurality of modes comprise mode C for requesting aircraft altitude and mode 3A for requesting aircraft identification.

6. The transponder of claim 1, wherein said programmable receive module comprises:
   a tunable frequency converter for down converting the received interrogation signal into an intermediate frequency signal;
   a digital converter for converting the intermediate frequency signal into a digital signal and for providing the digital signal to the at least one receive field programmable gate array;
   a memory for storing the first configuration data; and
   processing means, coupled to said memory, for reconfiguring the at least one receive field programmable gate array in accordance with the first configuration data.

7. The transponder of claim 6, wherein said digital converter, said memory, said processing means and the at least one receive field programmable gate array are housed within a receive digital submodule, said digital converter being electrically isolated within said receive digital submodule.

8. The transponder of claim 1, wherein the at least one receive field programmable gate array is configurable to convert the received interrogation signal into a digital signal and to perform pulse detection, pulse width discrimination and interval discrimination processing on the digital signal to provide the transponder signal.

9. The transponder of claim 1, further comprising:
   a plurality of antennas for receiving radio frequency signals to provide the received interrogation signal and a plurality of respective received interrogation signals; and
   a plurality of additional programmable receive modules, each respectively including at least one receive field programmable gate array, for processing the respective received interrogation signals into respective transponder signals,
   said programmable transmit module performing diversity processing to determine which of the transponder signal and the respective transponder signals is the strongest and providing the response signal to the antenna which received the strongest radio frequency signal for transmission.

10. The transponder of claim 1, wherein the received interrogation signal is a radio frequency signal having a frequency in a range of 2–2,000 Mhz.

11. The transponder of claim 1, wherein said programmable receive module and said programmable transmit module are plug-in modules.

12. A programmable radio comprising:
    a receive module for processing a received interrogation signal into a transponder signal,
    said receive module including at least one receive field programmable gate array, reconfigurable in accordance with first configuration data, for processing the received interrogation signal in one of a plurality of interrogation modes specified by the first configuration data to provide the transponder signal; and
    a transmit module, coupled to said receive module, for processing the transponder signal to generate and transmit a response signal.

13. The programmable radio of claim 12, wherein said transmit module comprises a transmit field programmable gate array, reconfigurable in accordance with second configuration data, for processing the transponder signal into the response signal in the corresponding one of the plurality of interrogation modes specified by the second configuration data.

14. The programmable radio of claim 13, wherein said transmit module further comprises:
    a memory for storing the second configuration data; and
    processing means, coupled to said memory, for reconfiguring said transmit field programmable gate array in accordance with the second configuration data.

15. The programmable radio of claim 12, wherein the plurality of interrogation modes comprise communication, navigation and identification modes.

16. The programmable radio of claim 15, wherein the plurality of modes comprise mode C for requesting aircraft altitude and mode 3A for requesting aircraft identification.

17. The programmable radio of claim 12, wherein said receive module comprises:
    a tunable frequency converter for down converting the received interrogation signal into an intermediate frequency signal;
    a digital converter for converting the intermediate frequency signal into a digital signal and for providing the digital signal to the at least one receive field programmable gate array;
    a memory for storing the first configuration data; and
    processing means, coupled to said memory, for reconfiguring the at least one receive field programmable gate array in accordance with the first configuration data.

18. The programmable radio of claim 12, wherein said digital converter, said memory, said processing means and the at least one receive field programmable gate array are housed within a receive digital submodule, said digital converter being electrically isolated within said receive digital submodule.

19. The programmable radio of claim 12, wherein the at least one receive field programmable gate array is configurable to convert the received interrogation signal into a digital signal and to perform pulse detection, pulse width discrimination and interval discrimination processing on the digital signal to provide the transponder signal.

20. The programmable radio of claim 12, further comprising:
    a plurality of antennas for receiving radio frequency signals to provide the received interrogation signal and a plurality of respective received interrogation signals; and
    a plurality of additional receive modules, each respectively including at least one receive field programmable gate array, for processing the respective received interrogation signals into respective transponder signals,
    said transmit module performing diversity processing to determine which of the transponder signal and the respective transponder signals is the strongest and providing the response signal to the antenna which received the strongest radio frequency signal for transmission.

21. The programmable radio of claim 12, wherein the received interrogation signal is a radio frequency signal having a frequency in a range of 2–2,000 Mhz.

22. The programmable radio of claim 12, wherein said receive module and said transmit module are plug-in modules.

* * * * *